United States Patent
Corneille et al.

(10) Patent No.: US 10,128,391 B2
(45) Date of Patent: Nov. 13, 2018

(54) PHOTOVOLTAIC MODULE WITH FLEXIBLE WIRE INTERCONNECTION

(71) Applicant: BEIJING APOLLO DING RONG SOLAR TECHNOLOGY CO., LTD., Beijing (CN)

(72) Inventors: Jason Corneille, Boulder Creek, CA (US); Todd Krajewski, Mountain View, CA (US)

(73) Assignee: BEIJING APOLLO DING RONG SOLAR TECHNOLOGY CO., LTD., Beijing (CN)

( * ) Notice: Subject to any disclaimer, the term of this patent is extended or adjusted under 35 U.S.C. 154(b) by 87 days.

(21) Appl. No.: 15/189,818

(22) Filed: Jun. 22, 2016

(65) Prior Publication Data

US 2017/0373204 A1 Dec. 28, 2017

(51) Int. Cl.
*H01L 31/0392* (2006.01)
*H01L 31/0224* (2006.01)
*H01L 31/0749* (2012.01)
*H01L 31/05* (2014.01)
*H01L 31/18* (2006.01)

(52) U.S. Cl.
CPC ........ *H01L 31/03928* (2013.01); *H01L 31/022466* (2013.01); *H01L 31/0508* (2013.01); *H01L 31/0512* (2013.01); *H01L 31/0749* (2013.01); *Y02E 10/50* (2013.01)

(58) Field of Classification Search
CPC ..... H01L 31/022425; H01L 31/022466; H01L 31/03928; H01L 31/0508; H01L 31/0749; H01L 31/0398
See application file for complete search history.

(56) References Cited

U.S. PATENT DOCUMENTS

| | | |
|---|---|---|
| 3,376,164 A | 4/1968 | Bachwansky |
| 3,553,030 A | 1/1971 | Lebrun |
| 3,713,893 A | 1/1973 | Shirland |
| 4,574,160 A | 3/1986 | Cull et al. |
| 5,034,068 A | 7/1991 | Glenn et al. |

(Continued)

FOREIGN PATENT DOCUMENTS

DE 27 57 301 A1 7/1979

OTHER PUBLICATIONS

Richards, et al., "Enhancing the efficiency of production Cds/CdTe PV modules by overcoming poor spectral response at short wavelengths via luminescence down-shifting," 2006 IEEE $4^{th}$ World Conference on Photovoltaic Energy Conversion, May 7-12, 2006, 4 pages.

(Continued)

*Primary Examiner* — Bethany L Martin
(74) *Attorney, Agent, or Firm* — The Marbury Law Group PLLC

(57) ABSTRACT

A solar panel includes a first photovoltaic cell, a second photovoltaic cell, and a flexible electrical connection structure which comprises an electrically conductive connector that electrically connects the first photovoltaic cell and the second photovoltaic cell in series along a connection direction. The electrically conductive connector does not extend from a first major surface of a flexible transparent insulating sheet through a thickness of the flexible transparent insulating sheet to a second major surface of the flexible transparent insulating sheet.

10 Claims, 18 Drawing Sheets

(56) References Cited

U.S. PATENT DOCUMENTS

| | | |
|---|---|---|
| 5,391,235 A | 2/1995 | Inoue |
| 5,474,621 A | 12/1995 | Barnard |
| 5,626,688 A | 5/1997 | Probst et al. |
| 5,814,195 A | 9/1998 | Lehan et al. |
| 5,861,324 A | 1/1999 | Ichinose et al. |
| 6,184,458 B1 | 2/2001 | Murakami et al. |
| 6,231,732 B1 | 5/2001 | Hollars et al. |
| 6,365,010 B1 | 4/2002 | Hollars |
| 6,372,538 B1 | 4/2002 | Wendt et al. |
| 6,479,744 B1 | 11/2002 | Tsuzuki et al. |
| 6,488,824 B1 | 12/2002 | Hollars et al. |
| 6,600,100 B2 | 7/2003 | Ho et al. |
| 6,974,976 B2 | 12/2005 | Hollars |
| 8,134,069 B2 | 3/2012 | Mackie et al. |
| 8,912,429 B2 | 12/2014 | Wudu et al. |
| 2004/0069340 A1 | 4/2004 | Luch |
| 2004/0118448 A1 | 6/2004 | Scher et al. |
| 2005/0072461 A1 | 4/2005 | Kuchinski et al. |
| 2005/0109392 A1 | 5/2005 | Hollars |
| 2005/0176270 A1 | 8/2005 | Luch |
| 2005/0241692 A1 | 11/2005 | Rubin et al. |
| 2005/0274408 A1 | 12/2005 | Li et al. |
| 2006/0032752 A1 | 2/2006 | Luch |
| 2006/0180195 A1 | 8/2006 | Luch |
| 2006/0207646 A1 | 9/2006 | Terreau et al. |
| 2007/0283996 A1 | 12/2007 | Hatchmann et al. |
| 2007/0283997 A1 | 12/2007 | Hatchmann et al. |
| 2008/0053519 A1 | 3/2008 | Pearce et al. |
| 2009/0025778 A1* | 1/2009 | Rubin ............ H01L 27/1421 136/246 |
| 2009/0235979 A1* | 9/2009 | Wudu ............ H01L 31/022425 136/256 |

OTHER PUBLICATIONS

Untila, et al., "19.2% Efficent Bifacial ITO-(P$^+$Nn$^+$)Si-ITO Laminated Grid Cell," 16$^{th}$ European Photovoltaic Solar Energy Conference, May 1-5, 2000, Glasgow, UK, pp. 1489-1491.

U.S. Appl. No. 11/451,604, Office Action dated Jan. 22, 2016, 14 pgs.

U.S. Appl. No. 11/451,616, Office Action dated Mar. 10, 2016, 22 pgs.

\* cited by examiner

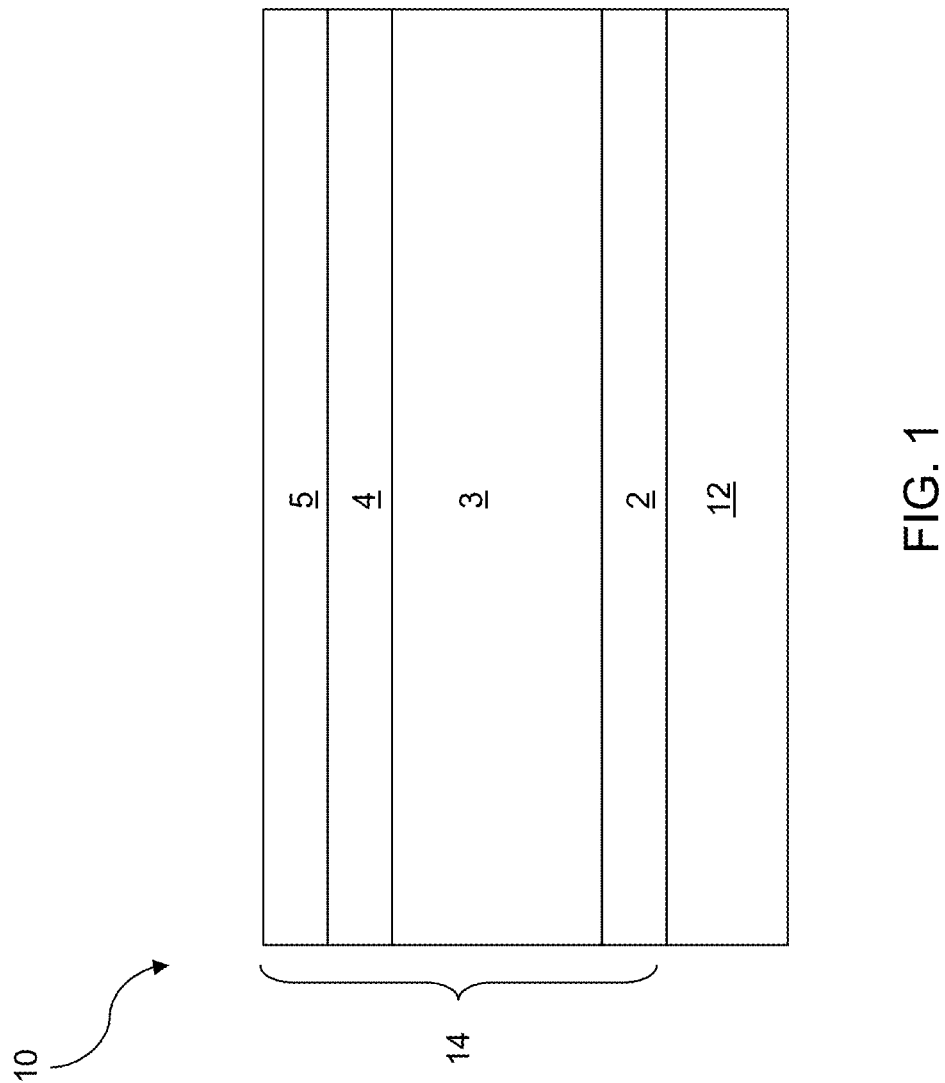

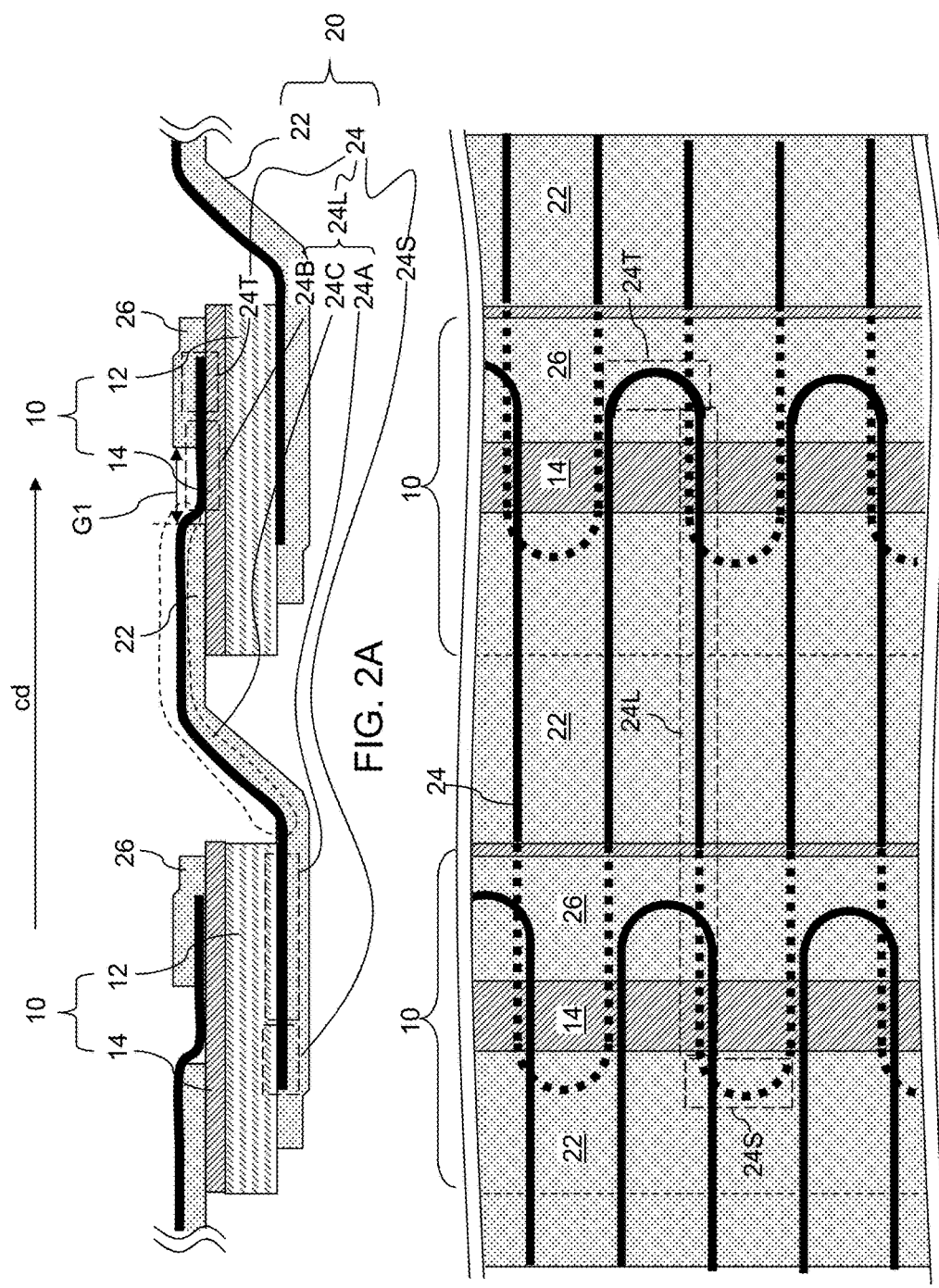

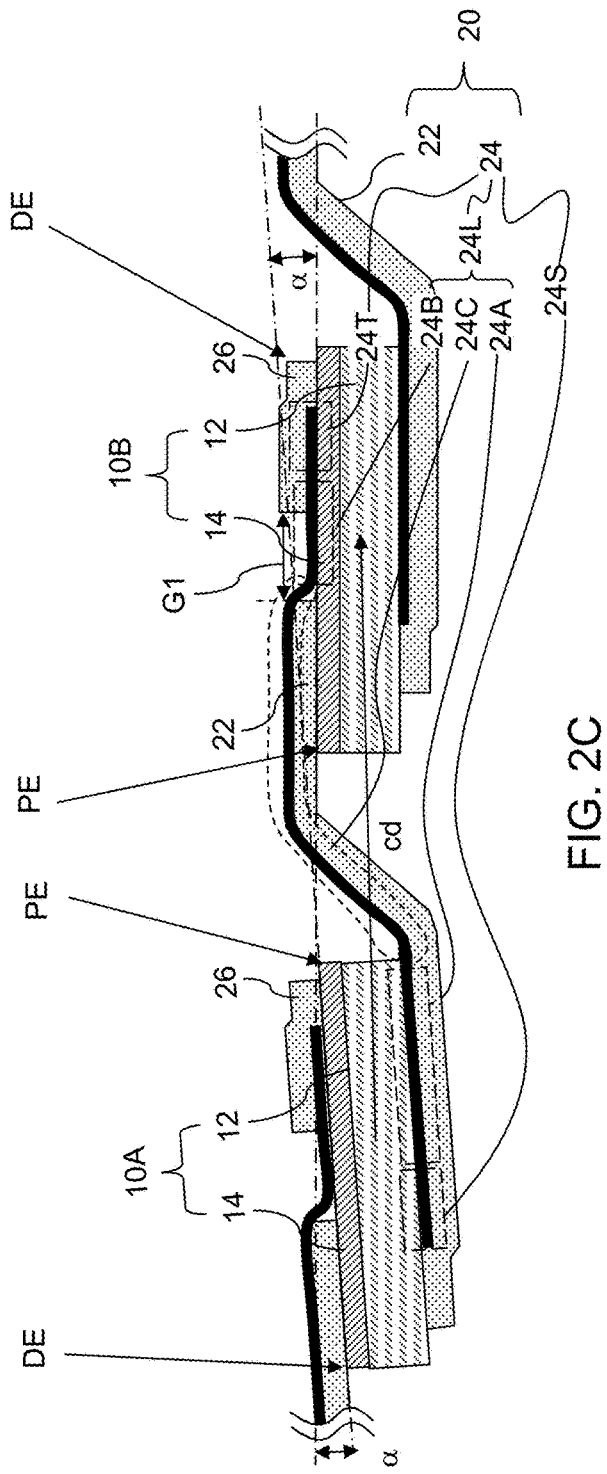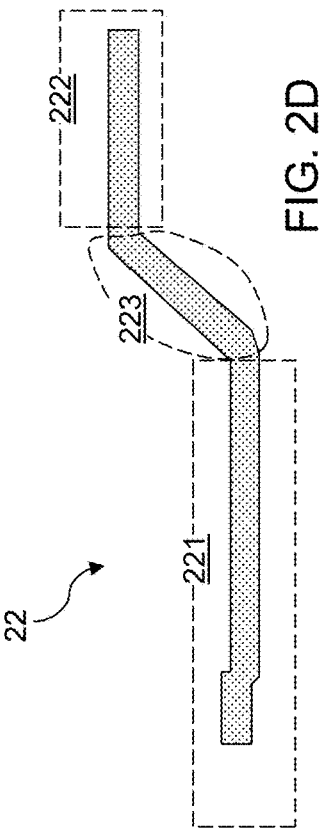

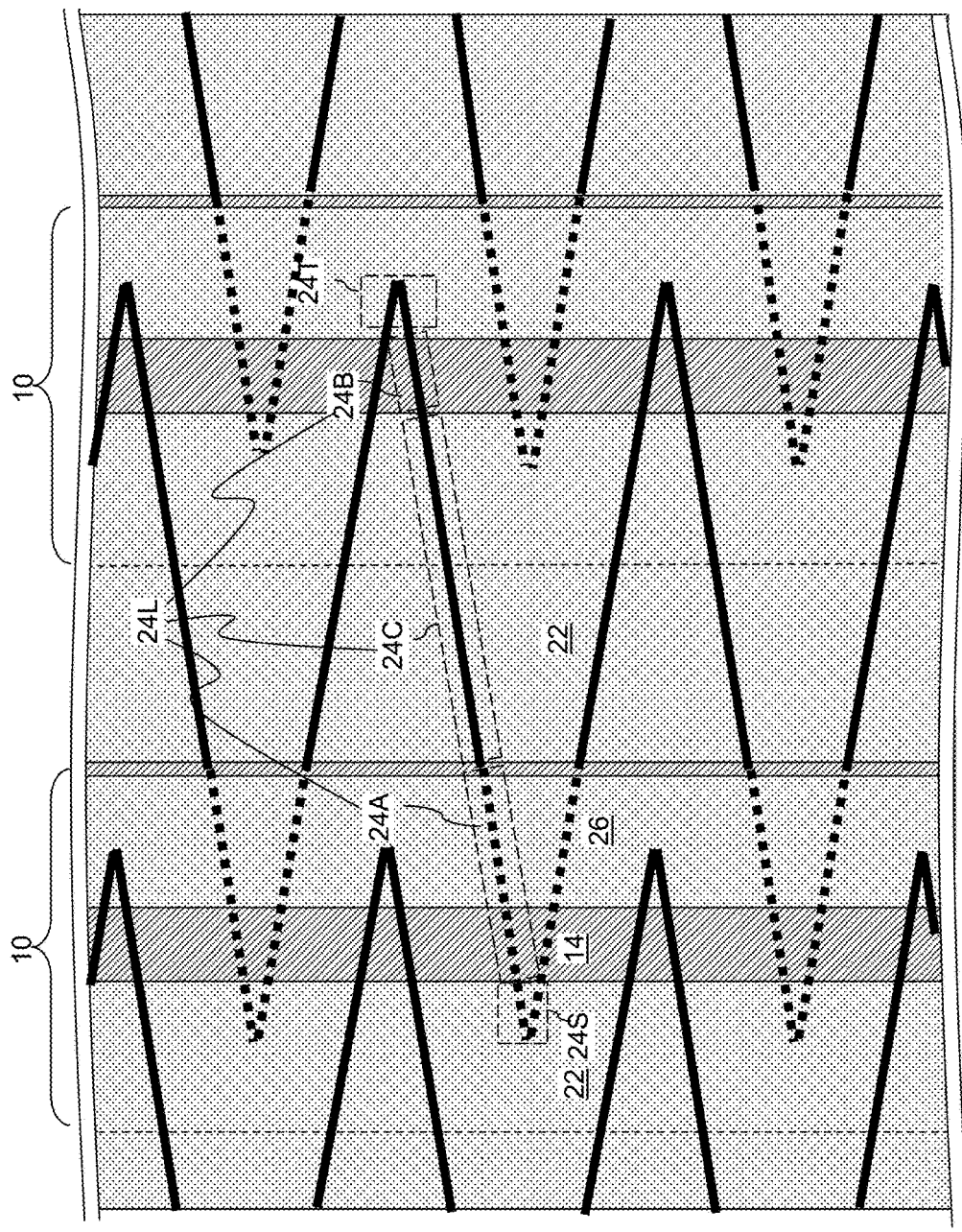

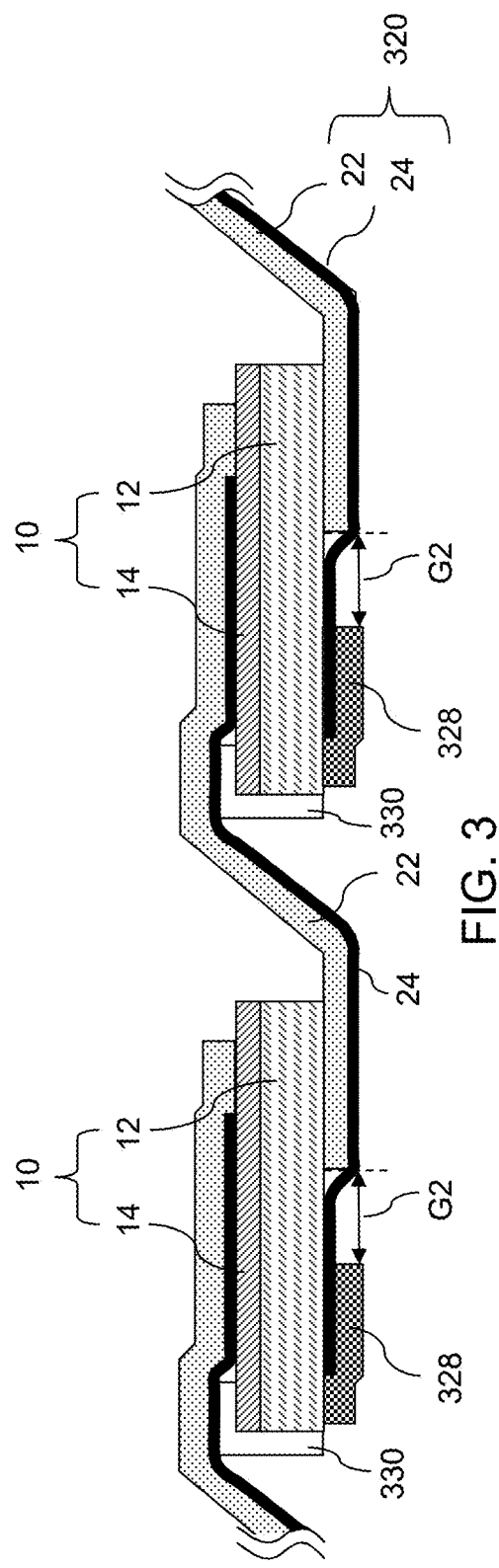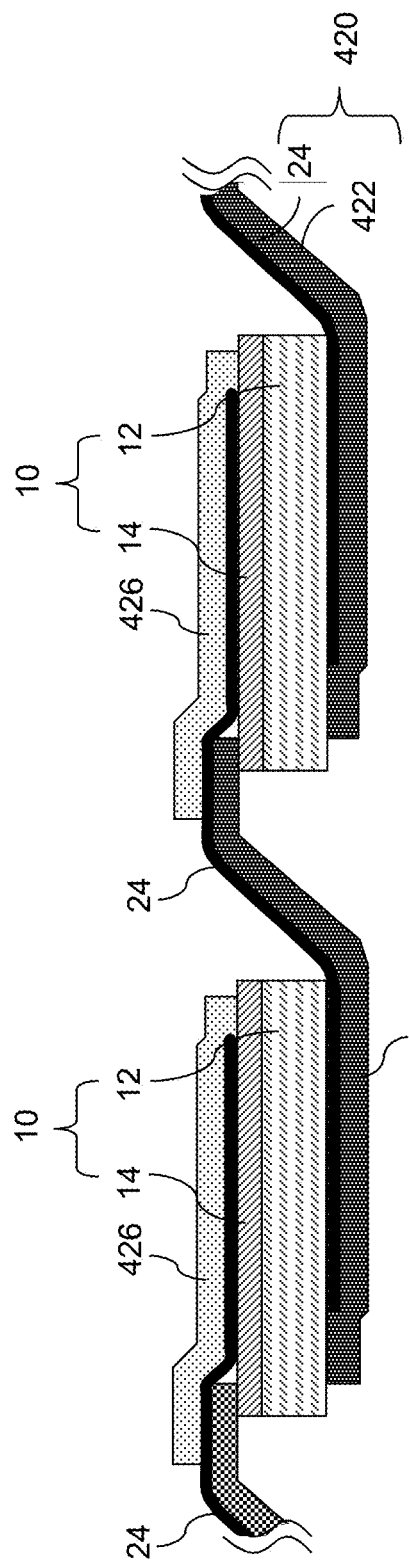

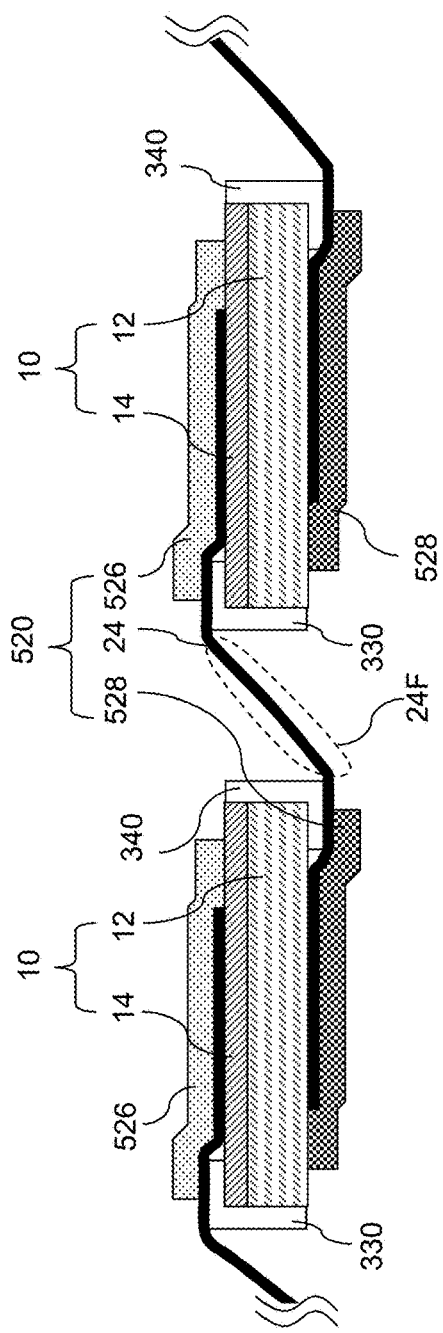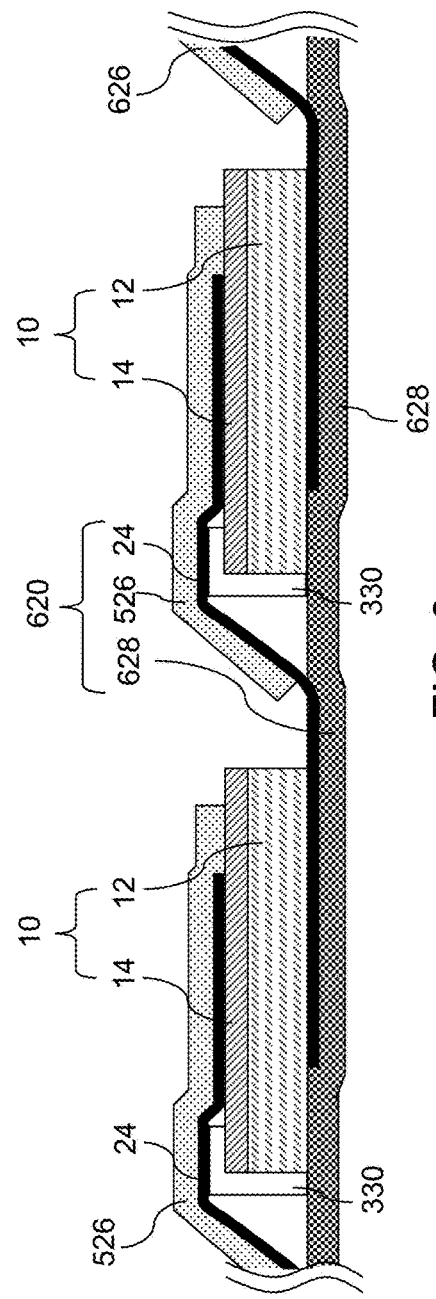

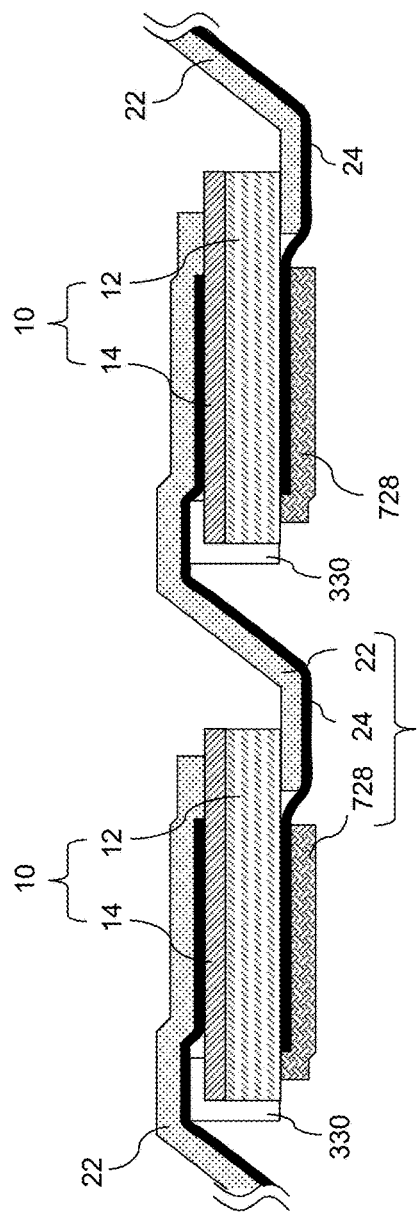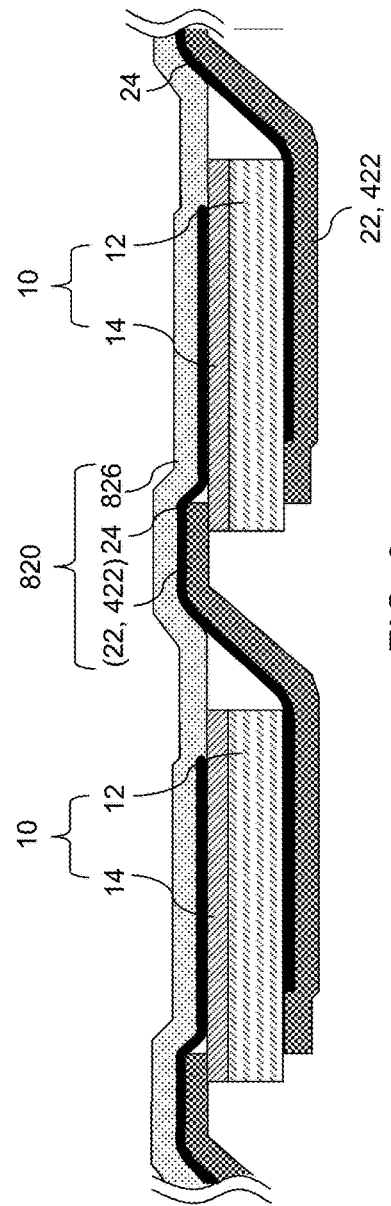

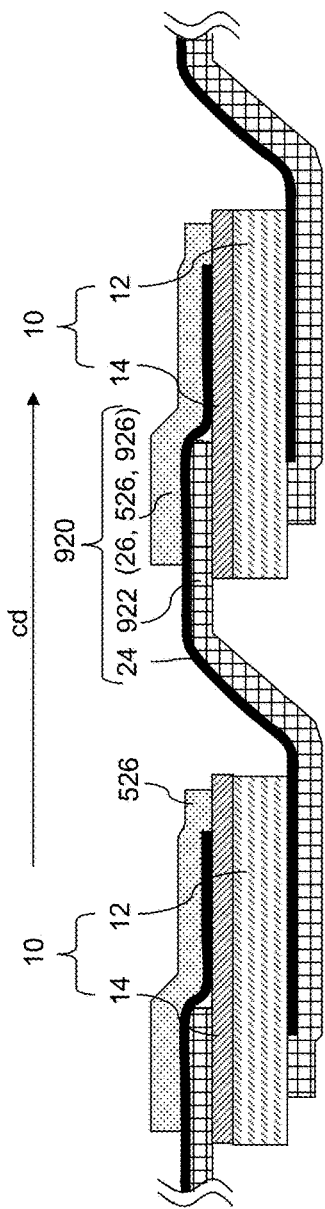
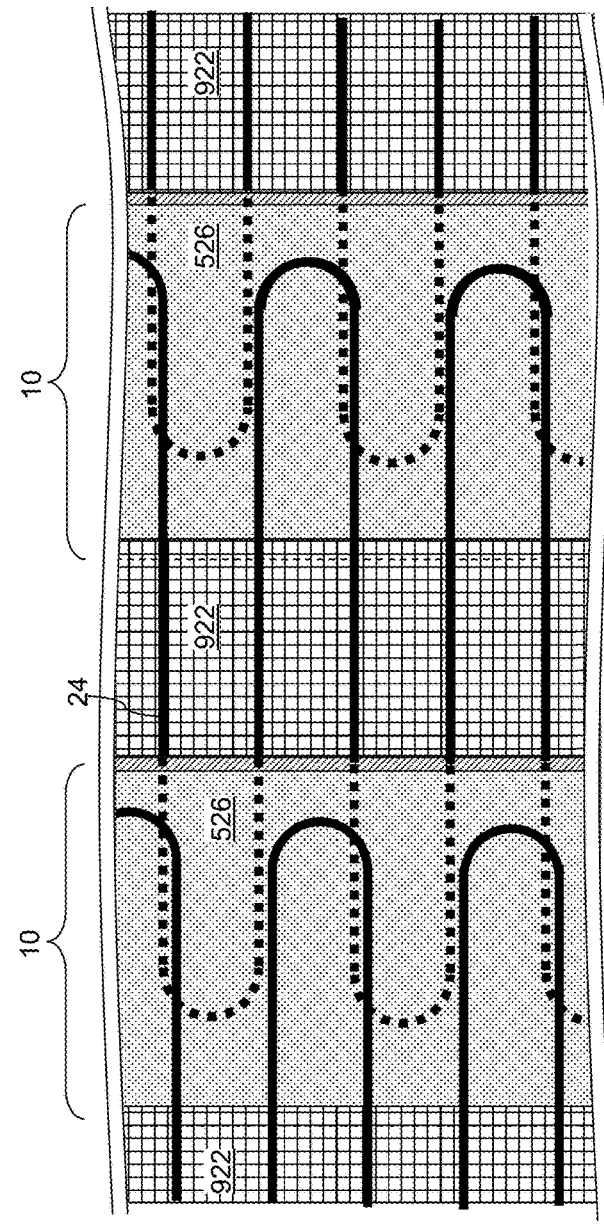
FIG. 9A
FIG. 9B

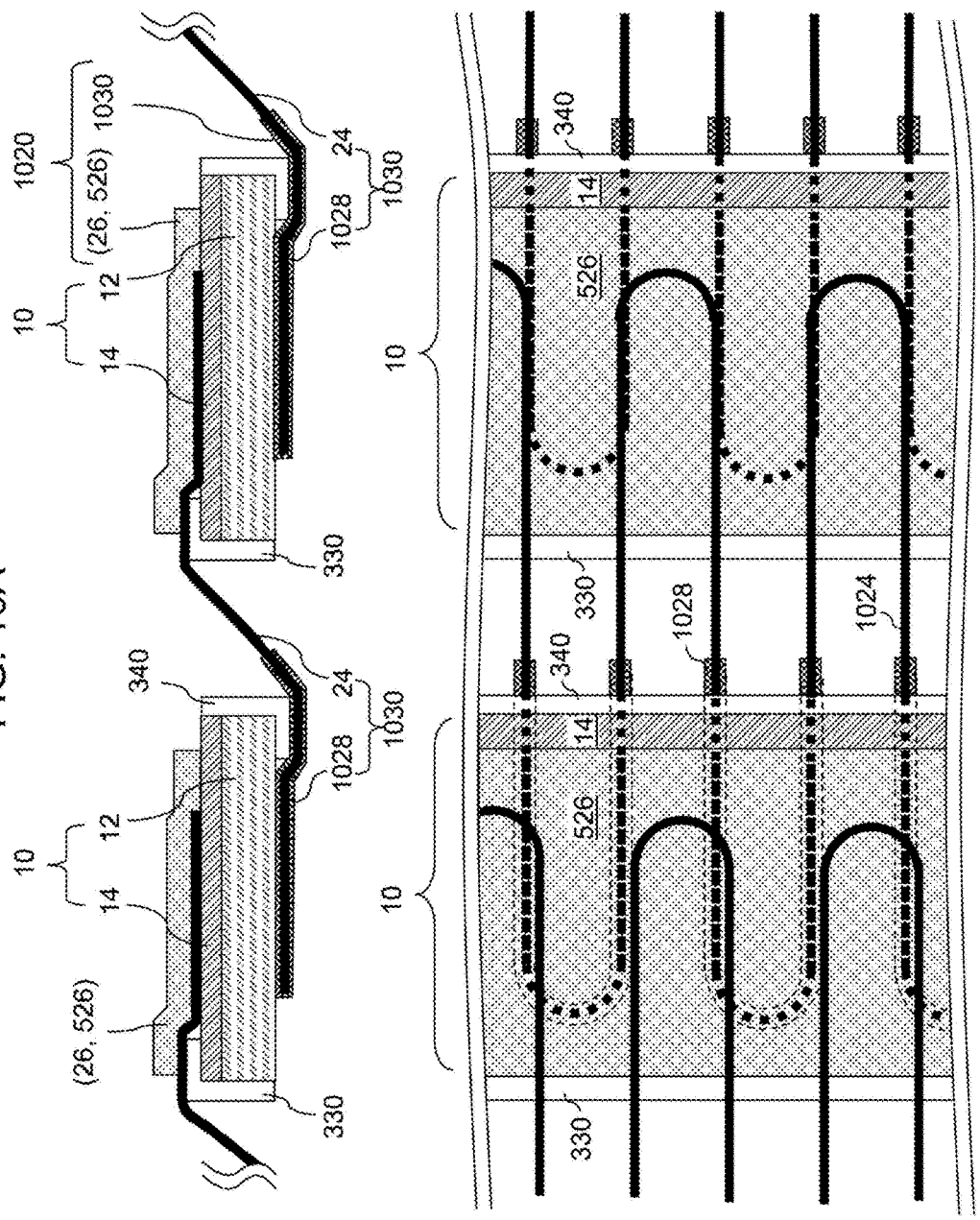

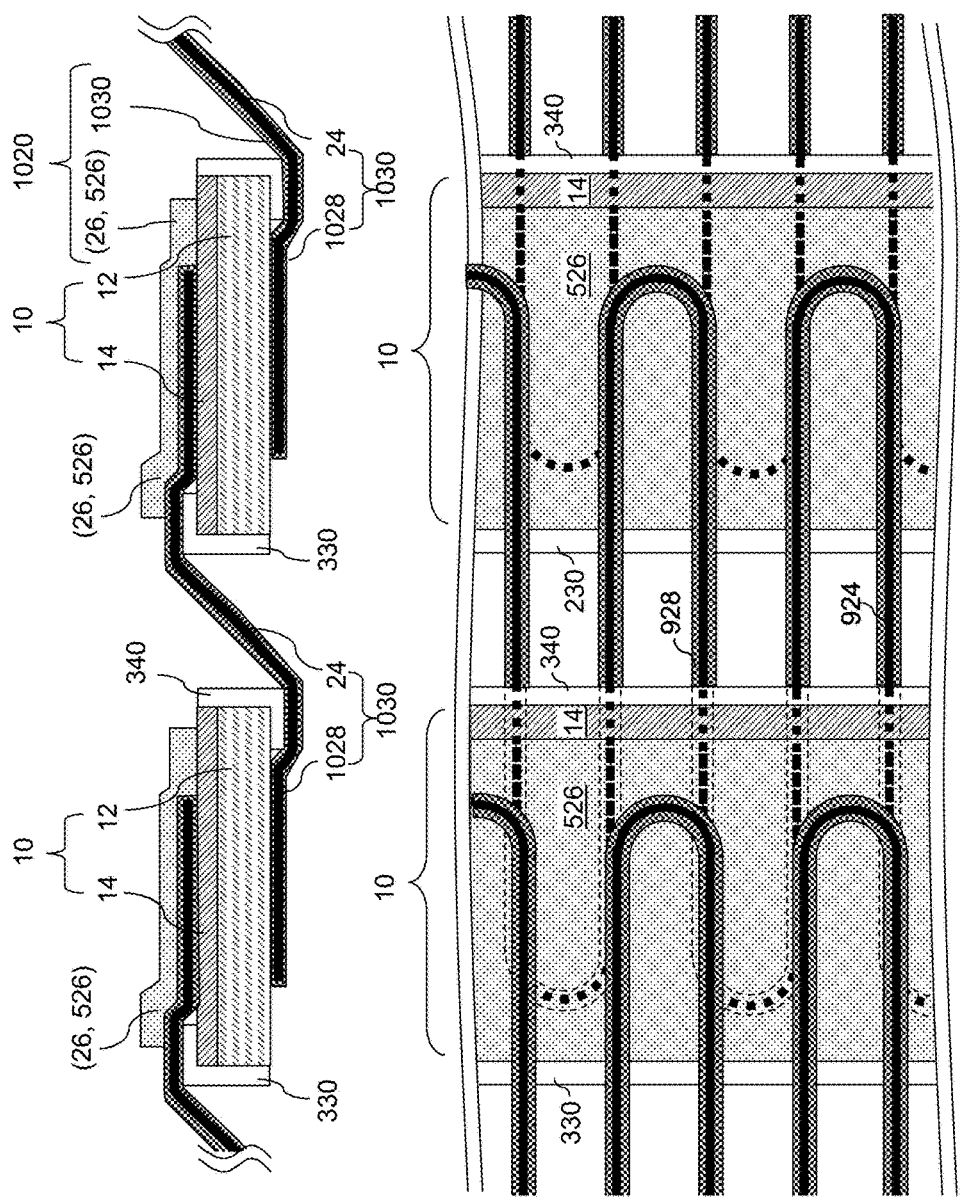

PHOTOVOLTAIC MODULE WITH FLEXIBLE WIRE INTERCONNECTION

FIELD

The present disclosure is directed generally to photovoltaic devices, and specifically to solar panels with flexible interconnections and methods of manufacturing the same.

BACKGROUND

Flexible solar panels provide interconnection among multiple photovoltaic cells employing the "tab and string" technique, in which two or three conductive ribbons are soldered between the front and back surfaces of adjacent cells.

Such methods of providing interconnections among adjacent photovoltaic cells suffer from many deficiencies. For example, solder joints can fail from thermal coefficient of expansion mismatches and defects. Further, known methods oftentimes require significant labor or capital equipment to assemble photovoltaic cells. In addition, formation of closely packed photovoltaic cells is difficult for such methods.

SUMMARY

According to an aspect of the present disclosure, a solar panel includes a first photovoltaic cell, a second photovoltaic cell, and a flexible electrical connection structure which comprises an electrically conductive connector that electrically connects the first photovoltaic cell and the second photovoltaic cell in series along a connection direction. The electrically conductive connector does not extend from a first major surface of a flexible transparent insulating sheet through a thickness of the flexible transparent insulating sheet to a second major surface of the flexible transparent insulating sheet.

According to another aspect of the present disclosure, a method of forming a solar panel comprises forming a first photovoltaic cell; forming a second photovoltaic cell, forming a flexible electrical connection structure which comprises an electrically conductive connector, and electrically connecting the first photovoltaic cell and the second photovoltaic cell in series along a connection direction using the flexible electrical connection structure after the steps of forming the first and the second photovoltaic cells and the flexible electrical connection structure. The electrically conductive connector does not extend from a first major surface of a flexible transparent insulating sheet through a thickness of the flexible transparent insulating sheet to a second major surface of the flexible transparent insulating sheet.

BRIEF DESCRIPTION OF THE DRAWINGS

FIG. 1 illustrates a vertical cross-sectional view of an exemplary solar cell according to an embodiment of the present disclosure.

FIG. 2A illustrates a vertical cross-sectional view of first exemplary interconnected solar cells according to an embodiment of the present disclosure.

FIG. 2B illustrates a top-down view of the first exemplary interconnected solar cells of FIG. 2A.

FIG. 2C illustrates a vertical cross-sectional view of the first exemplary interconnected solar cells in a state in which the neighboring top surfaces of a pair of photovoltaic cells form a non-zero angle α according to an embodiment of the present disclosure.

FIG. 2D illustrates a flexible transparent insulating sheet according to an embodiment of the present disclosure.

FIGS. 2E-2G illustrate alternative exemplary bending patterns for zig-zag conductive wires according to embodiments of the present disclosure.

FIG. 3 illustrates a vertical cross-sectional view of second exemplary interconnected solar cells according to an embodiment of the present disclosure.

FIG. 4 illustrates a vertical cross-sectional view of third exemplary interconnected solar cells according to an embodiment of the present disclosure.

FIG. 5 illustrates a vertical cross-sectional view of fourth exemplary interconnected solar cells according to an embodiment of the present disclosure.

FIG. 6 illustrates a vertical cross-sectional view of fifth exemplary interconnected solar cells according to an embodiment of the present disclosure.

FIG. 7 illustrates a vertical cross-sectional view of sixth exemplary interconnected solar cells according to an embodiment of the present disclosure.

FIG. 8 illustrates a vertical cross-sectional view of seventh exemplary interconnected solar cells according to an embodiment of the present disclosure.

FIG. 9A illustrates a vertical cross-sectional view of eighth exemplary interconnected solar cells according to an embodiment of the present disclosure.

FIG. 9B illustrates a top-down view of the eighth exemplary interconnected solar cells of FIG. 9A.

FIG. 10A illustrates a vertical cross-sectional view of ninth exemplary interconnected solar cells according to an embodiment of the present disclosure.

FIG. 10B illustrates a top-down view of the ninth exemplary interconnected solar cells of FIG. 10A.

FIG. 11A illustrates a vertical cross-sectional view of tenth exemplary interconnected solar cells according to an embodiment of the present disclosure.

FIG. 11B illustrates a top-down view of the tenth exemplary interconnected solar cells of FIG. 11A.

DETAILED DESCRIPTION

Figure 2E:
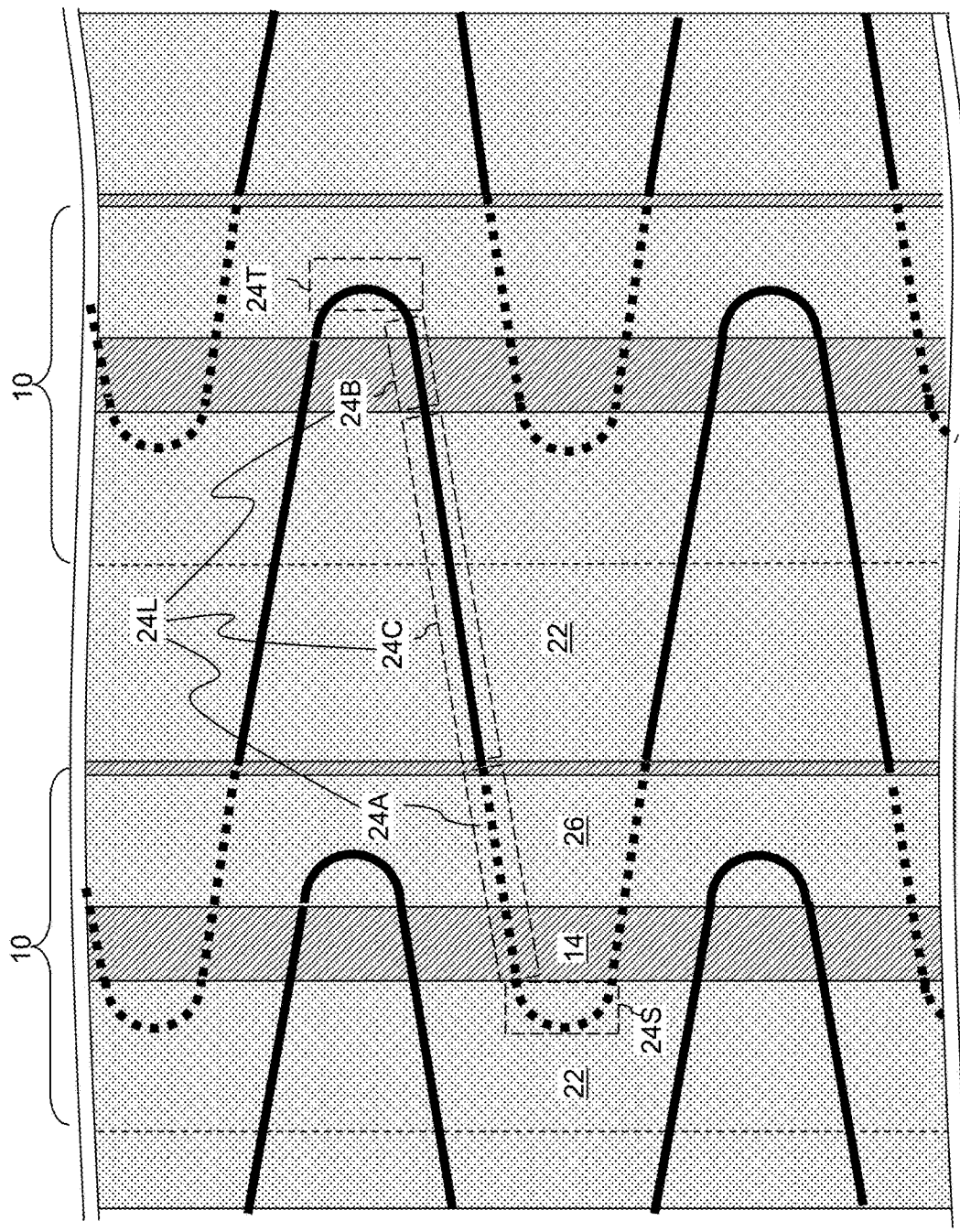

Same reference numerals in different figures refer to the same element or similar element having the same properties. As used herein, the term "module" includes an assembly of at least two, and preferably three or more electrically interconnected photovoltaic cells, which may also be referred to as "solar cells." As used herein, a "solar panel" is a module of at least two photovoltaic cells. As used herein, a "connector" refers to a structure that extends along a local lengthwise direction at each portion thereof and having a substantially uniform or non-uniform cross-sectional area along a plane perpendicular to the local lengthwise direction. It is understood that a wire can gradually change the local lengthwise direction to provide a global topology including curved portions. As used herein, a "conductive connector" refers to a connector consisting essentially of one or more electrically conductive materials. For example, the conductive connector may comprise a single continuous conductive wire, trace (e.g., a trace formed by coating a conductive ink on an underlying material), bar or strip. As used herein, a "zig-zag conductive wire" refers to a conductive wire having straight portions having different local lengthwise directions and adjoined by connecting portions in which the local lengthwise direction changes. As used herein, an element is "transparent" if the element allows at least 50% of radiation at wavelength of 500 nm to pass through. As used herein, an element is "opaque" if the element allows less than 50% of radiation at wavelength of 500 nm to pass through.

Referring to FIG. 1, a vertical cross-sectional view of a photovoltaic cell 10 is illustrated. The photovoltaic cell 10 includes a substrate, such as an electrically conductive substrate 12, a first electrode 2, a p-doped semiconductor layer 3, an n-doped semiconductor layer 4, a second electrode 5, and an optional antireflective (AR) coating layer (not shown). The electrodes 2 and 5, the p-doped semiconductor layer 3, the n-doped semiconductor layer 4, and the optional AR coating layer are collectively referred to as a photovoltaic film stack 14, which is a stack of various films that form a photovoltaic structure.

The substrate 12 is preferably a flexible, electrically conductive material, such as a metallic foil that is fed into a system of one or more process modules as a web for deposition of additional layers thereupon. For example, the metallic foil of the conductive substrate 12 can be a sheet of a metal or a metallic alloy such as stainless steel, aluminum, or titanium. If the substrate 12 is electrically conductive, then it may comprise a part of the back side (i.e., first) electrode of the cell 10. Thus, the first (back side) electrode of the cell 10 may be designated as (2, 12). Alternatively, the conductive substrate 12 may be an electrically conductive or insulating polymer foil. Still alternatively, the substrate 12 may be a stack of a polymer foil and a metallic foil. The thickness of the substrate 12 can be in a range from 100 microns to 2 mm, although lesser and greater thicknesses can also be employed.

The first or back side electrode 2 may comprise any suitable electrically conductive layer or stack of layers. For example, electrode 2 may include a metal layer, which may be, for example, molybdenum. Alternatively, a stack of molybdenum and sodium and/or oxygen doped molybdenum layers may be used instead, as described in U.S. Pat. No. 8,134,069, which is incorporated herein by reference in its entirety. The electrode 2 can have a thickness in a range from 500 nm to 1 micron, although lesser and greater thicknesses can also be employed.

The p-doped semiconductor layer 3 can include a p-type, sodium doped copper indium gallium selenide (CIGS), which functions as a semiconductor absorber layer. The thickness of the p-doped semiconductor layer 3 can be in a range from 1 microns to 5 microns, although lesser and greater thicknesses can also be employed.

The n-doped semiconductor layer 4 includes an n-doped semiconductor material such as CdS, ZnS, ZnSe, or an alternative metal sulfide or a metal selenide. The thickness of the n-doped semiconductor layer 4 is typically less than the thickness of the p-doped semiconductor layer 3, and can be in a range from 50 nm to 100 nm, although lesser and greater thicknesses can also be employed. The junction between the p-doped semiconductor layer 3 and the n-doped semiconductor layer 4 is a p-n junction. The n-doped semiconductor layer 4 can be a material which is substantially transparent to at least part of the solar radiation. The n-doped semiconductor layer 4 is also referred to as a window layer or a buffer layer.

The second (e.g., front side or top) electrode 5 comprises one or more transparent conductive layers 5. The transparent conductive layer 5 is conductive and substantially transparent. The transparent conductive layer 5 can include one or more transparent conductive materials, such as ZnO, indium tin oxide (ITO), Al doped ZnO ("AZO"), or a combination or stack of higher resistivity AZO and lower resistivity ZnO, ITO and/or AZO layers.

The optional antireflective coating layer (not shown) is an optional layer. If present, the antireflective coating layer can decrease the amount of light that is reflected off the top surface of the photovoltaic cell, which is the surface that is located on the opposite side of the substrate 12. In one embodiment, the antireflective coating layer can be deposited directly on the top surface of the second electrode 5. Alternatively or additionally, a transparent cover glass can be disposed over the photovoltaic cell in a final product, and an antireflective coating layer can be formed on either side, or on both sides, of the transparent cover glass.

Referring to FIGS. 2A-2C, a solar panel (i.e., module) can be formed by forming flexible electrical connection structures 20 (i.e., interconnects) connecting a plurality of photovoltaic cells 10. The photovoltaic cells 10 can be arranged along a connection direction cd (such as the horizontal direction in FIG. 2A and the horizontal direction in FIG. 2B) after being interconnected by the flexible electrical connection structures 20. Variable angles α between top surfaces of each neighboring pair of photovoltaic cells 10 can be provided through a respective flexible electrical connection structure 20 therebetween. In case the angle α a between top surfaces of a neighboring pair of photovoltaic cells 10 is non-zero as illustrated in FIG. 2C, the connection direction cd is defined as the direction connecting the center of mass of the first photovoltaic cell and the center of mass of the second photovoltaic cell.

Each of the plurality of photovoltaic cells 10 can comprise a photovoltaic junction (3, 4), a first electrode (2, 12) located on a first side of the photovoltaic junction (3, 4), and a second electrode 5 located on a second side of the photovoltaic junction (3, 4) to provide a power output from the photovoltaic junction (3, 4) across the first and second electrodes upon illumination of light (e.g., sunlight) on the junction. In one embodiment, each of the flexible electrical connection structure 20 comprises a respective zig-zag conductive connector 24, such as a wire, that is attached to a respective neighboring pair of a first photovoltaic cell (e.g., the photovoltaic cell 10 illustrated on the left side of FIG. 2A) and a second photovoltaic cell (e.g., the photovoltaic cell 10 illustrated on the right side of FIG. 2A). While a wire will be described as a preferred connector in the following embodiments for ease of description, it should be understood that other types of connectors (e.g., trace, strip, etc.) may be used instead.

Each zig-zag conductive wire 24 is attached to the bottom surface of a respective first photovoltaic cell (which may a bottom surface of the substrate 12 if the substrate is electrically conductive) and to the top surface of a respective second photovoltaic cell (which is a top surface of the second electrode 5 of the second photovoltaic cell). Each zig-zag conductive wire 24 can have a non-rectangular and substantially uniform cross-sectional shape in a plane perpendicular to the local lengthwise direction. For example, each zig-zag conductive wire 24 can have a substantially circular cross-sectional shape or an elliptical cross-sectional shape. The maximum lateral dimension of each zig-zag conductive wire 24, which is defined as the maximum dimension of the non-rectangular and substantially uniform cross-sectional shape, can be in a range from 30 microns to 3 mm. In one embodiment, the maximum lateral dimension of each zig-zag conductive wire 24 can be in a range from 60 microns to 1.5 mm. In one embodiment, the maximum lateral dimension of each zig-zag conductive wire 24 can be in a range from 120 microns to 750 microns. In case the non-rectangular and substantially uniform cross-sectional shape is a circle, the maximum lateral dimension can be the diameter of the zig-zag conductive wire 24. In case the non-rectangular and substantially uniform cross-sectional shape is an ellipse, a superellipse, or an oval, the maximum lateral dimension can be the maximum distance between two points of the cross-sectional shape of the zig-zag conductive wire 24 such as the major axis. Alternatively, the wire 24 may have a rectangular cross sectional shape.

Each zig-zag conductive wire 24 can be manufactured by providing a straight wire or a wound wire, and by bending various sections to form bending portions (24S, 24T), which include first bending portions 24S and second bending portions 24T. In one embodiment, the first bending portions 24S include each odd-numbered bent portion as counted from one side of a respective zig-zag conductive wire 24 and the second bending portions 24T include each even-numbered bent portion as counted from the same side of the respective zig-zag conductive wire 24. Alternatively, the first bending portions 24S include each even-numbered bent portion as counted from one side of a respective zig-zag conductive wire 24 and the second bending portions 24T include each odd-numbered bent portion as counted from the same side of the respective zig-zag conductive wire 24.

Each zig-zag conductive wire 24 can be attached to the first (e.g., back side or bottom) electrode (2, 12) of the first photovoltaic cell and the second (e.g., front side or top) electrode 5 of the second photovoltaic cell within each respective neighboring pair of photovoltaic cells employing at least one additional structure that has an electrically insulating surface that is connected to the bottom surface of the first electrode of the first photovoltaic cell or to the top surface of the second electrode of the second photovoltaic cell. The at least one additional structure may have an adhesive surface, comprise an adhesive material or have an adhesive material placed between its surface and the electrode to connect the at least one additional structure to the electrode. Alternatively or additionally, each zig-zag conductive wire 24 can be attached to the first electrode of the first photovoltaic cell and the second electrode of the second photovoltaic cell within each respective neighboring pair of photovoltaic cells employing a conductive adhesive material (such as a conductive paste or glue).

Each zig-zag conductive wire 24 comprises a plurality of substantially linear portions 24L, first bending portions 24S that contact a first electrode (2, 12) of the first photovoltaic cell, and second bending portions 24T that contact a second electrode 5 of the second photovoltaic cell. The first bending portions 24S adjoin neighboring pairs of the plurality of substantially linear (e.g., straight) portions 24L underneath the first electrode (2, 12) of the first photovoltaic cell. The second bending portions 24T adjoin neighboring pairs of the plurality of substantially linear portions 24L over the second electrode 5 of the second photovoltaic cell.

Each of the plurality of substantially linear portions 24L comprises a first end portion 24A that underlies and contacts the first electrode (2, 12) of the first photovoltaic cell, a second end portion 24B that overlies and contacts the second electrode 5 of the second photovoltaic cell, and a connection portion 24C that connects the first end portion 24A and the second end portion 24B and does not directly contact the first or second photovoltaic cells 10. In one embodiment, each substantially linear portion 24L can extend farther along the connection direction cd than along any direction that is perpendicular to the connection direction cd. In an alternative configuration, only the bending portions 24S and 24T underlie or overlie the photovoltaic cells 10 and end portions 24A and 24B are omitted.

In one embodiment, two cells in a neighboring pair of photovoltaic cells 10 do not overlap each other. In other words, no portion of cell 10A in FIG. 2C lies above or below cell 10B in FIG. 2C. To express this geometrically, two cells 10 in a neighboring pair of cells do not have any areal overlap therebetween in plan views along any direction that is perpendicular to one of the top surfaces of the neighboring pair of photovoltaic cells while the top surfaces of the neighboring pair of photovoltaic cells 10 form any angle α between a negative maximum value and a positive maximum value. Thus, as the direction of view for the plan views changes from the direction perpendicular to the top surface of the first photovoltaic cell to the direction perpendicular to the top surface of the second photovoltaic cell, no areal overlap between the first photovoltaic cell and the second photovoltaic cell for each given value of the angle α. As used herein, the angle α is negative if distal edges ("DE" in FIG. 2C) of the neighboring photovoltaic cells are raised more above proximal edges ("PE" in FIG. 2C) of the photovoltaic cells 10, and is positive if the proximal edges of the neighboring photovoltaic cells are raised above the distal edges of the photovoltaic cells as illustrated in FIG. 2C. In an illustrative example, the negative maximum value for the angle α may be in a range from −30 degrees to 0.001 degrees, and the positive maximum value for the angle α may be in a range from 0.001 degrees to 30 degrees, although greater ranges can also be employed for the angle α. In an alternative configuration, two neighboring cells 10 may overlap with each other (i.e., one cell 10 may overlie another cell 10).

In one embodiment, the substantially linear portions 24L can be parallel to each other (i.e., parallel among one another) in the plan views as illustrated in FIG. 2B.

In one embodiment, each of the first and second bending portions (24S, 24T) can change a propagation direction of the respective zig-zag conductive wire 24 by a range from 90 degrees to 270 degrees. In one embodiment, each of the first and second bending portions (24S, 24T) can change a propagation direction of the respective zig-zag conductive wire 24 by a range from 150 degrees to 210 degrees. In one embodiment, each of the first and second bending portions (24S, 24T) can change a propagation direction of the respective zig-zag conductive wire 24 by a range from 165 degrees to 195 degrees. In one embodiment, each of the first and second bending portions (24S, 24T) can change a propagation direction of the respective zig-zag conductive wire 24 by an angle that is substantially 180 degrees.

In one embodiment, each neighboring pair of photovoltaic cells 10 can be physically adjoined to each other through a respective flexible, transparent, electrically insulating sheet 22. In one embodiment, the flexible transparent insulating sheet 22 can include a transparent polymeric film, a transparent non-polymeric film, a transparent oligomer film, or a combination thereof. The flexible transparent insulating sheet can have an adhesive coating on each side that contacts the photovoltaic cells 10. Each flexible transparent insulating sheet 22 can be attached to at least one photovoltaic cell 10 by an adhesive material or an adhesive surface of the flexible transparent insulating sheet 22. In an alternative embodiment, the flexible transparent insulating sheet 22 may comprise a pressure sensitive adhesive (PSA) sheet.

Thus, the flexible electrical connection structure 20 (i.e., interconnect) in this embodiment comprises at least the sheet 22 and the connector (e.g., wire) 24. Thus, the photovoltaic cells 10 are first formed as independent units and the flexible electrical connection structure 20 (i.e., interconnect) is formed separate from the photovoltaic cells 10 by forming the wire 24 in contact with the sheet 22. The flexible electrical connection structure 20 comprising the wire 24 and sheet 22 is then connected to the back side (e.g., the first electrode (2, 12)) of the first photovoltaic cell 10 and to the front side (e.g., to the second electrode 5) of the second photovoltaic cell 10 to electrically connect the two photovoltaic cells 10 in series using the wire 24.

FIG. 2D illustrates various portions of a flexible transparent insulating sheet 22 of one embodiment which comprises a first end region 221 that underlies and contacts the first electrode of the first photovoltaic cell within the neighboring pair, a second end region 222 that overlies and contacts the second electrode of the second photovoltaic cells within the neighboring pair, and a connection region 223 that connects the first and second end portions (221, 222) of the respective flexible transparent insulating sheet 22. Each connection portion 24C of the zig-zag conductive wire 24 can be attached to the connection region 223 of the flexible transparent insulating sheet 22, for example, by an adhesive, to structurally secure the connection portions 24C and to reduce mechanical stress thereupon. While the illustrated portion of the first end region 221 is shown as being recessed with respect to the bottom surface of the first photovoltaic cell in FIG. 2D to show the location of the zig-zag conductive wire 24, it should be understood that no actual recess needs to be made in portions of the first end region 221 that underlie the zig-zag conductive wire 24. Generally, any portion of the flexible transparent insulating sheet 22 that is not separated from a photovoltaic cell by a zig-zag conductive wire 24 can be physically attached to the photovoltaic cell by an adhesive material of the flexible transparent insulating sheet 22 or an externally applied conductive adhesive material.

Referring collectively to FIGS. 2A-2D, the entirety of the first end portion 24A of the respective zig-zag conductive wire 24 can be is located between the first photovoltaic cell (e.g., cell 10A in FIG. 2C) and the first end region 221 of a respective flexible transparent insulating sheet 22, and a section of each connection portion 24C that overlies the second photovoltaic cell (e.g., cell 10B in FIG. 2C) can be spaced from the second photovoltaic cell by the second end region 222 of the respective flexible transparent insulating sheet 22.

In one embodiment, each second bending portion 24T can be contacted by a bottom surface of a respective overlying transparent insulating strip 26 that laterally extends along a direction that is substantially perpendicular to the connection direction cd, which is a direction of the view in FIGS. 2A and 2C. The strip 26 may optionally be part of the interconnect (i.e., the flexible electrical connection structure) 20 or formed separate from the interconnect.

Thus, in one embodiment, the flexible electrical connection structure 20 (i.e., interconnect) comprises at least the sheet 22, the strip 26 and the connector (e.g., wire) 24. The photovoltaic cells 10 are first formed as independent units and the flexible electrical connection structure 20 (i.e., interconnect) is formed separate from the photovoltaic cells 10 by forming the wire 24 in contact with the sheet 22 and the strip 26. The flexible electrical connection structure 20 comprising the wire 24, sheet 22 and strip 26 is then connected to the back side (e.g., the first electrode (2, 12)) of the first photovoltaic cell 10 and to the front side (e.g., to the second electrode 5) of the second photovoltaic cell 10 to electrically connect the two photovoltaic cells 10 in series using the wire 24.

Alternatively, the strip 26 is formed in a separate step from the sheet 22 and wire 24. In the alternative embodiment, the flexible electrical connection structure 20 (i.e., interconnect) comprises the sheet 22 and the connector (e.g., wire) 24 but not the strip 26. The photovoltaic cells 10 are first formed as independent units and the flexible electrical connection structure 20 (i.e., interconnect) is formed separate from the photovoltaic cells 10 by forming the wire 24 in contact with the sheet 22. The flexible electrical connection structure 20 comprising the wire 24 and sheet 22 is then connected to the back side (e.g., the first electrode (2, 12)) of the first photovoltaic cell 10 and to the front side (e.g., to the second electrode 5) of the second photovoltaic cell 10 to electrically connect the two photovoltaic cells 10 in series using the wire 24. The strip 26 is then formed over the wire 24 located in contact with the second electrode 5 of the second photovoltaic cell 10 in a later formation step.

In one embodiment, the respective overlying transparent insulating strip 26 can be spaced from the respective flexible transparent insulating sheet 22 to prevent an areal overlap therebetween. In one embodiment, a gap G1 may be present between each pair of a flexible transparent insulating sheet 22 and a transparent insulating strip 26 that overlie the same photovoltaic cell. In one embodiment, the gap G1 can be in a range from 1 mm to 30 cm, although lesser and greater distances can also be employed. The overlying transparent insulating strips 26 can include the same material as the respective flexible transparent insulating sheet 22, and may include an adhesive material therein, may be made entirely of an adhesive (e.g., PSA) or may be coated with an adhesive material on a side that contact the underlying photovoltaic cell. Alternatively, both sheet 22 and strips 26 may be made of an adhesive (e.g., PSA). In this case, the gap G1 may be omitted.

The thickness of the flexible transparent insulating sheet 22 can be in a range from 10 microns to 1 mm, although lesser and greater thicknesses can also be employed. The thickness of the transparent insulating strips 26 can be in a range from 10 microns to 1 mm, although lesser and greater thicknesses can also be employed.

FIG. 2E illustrates a variation of the structure of FIGS. 2A-2D, which can be derived by modifying the zig-zag conductive wires 24 such that not all of the substantially linear portions 24L are parallel to one another. For example, counting from one side to another along the direction perpendicular to the connection direction cd, every odd numbered substantially linear portion 24L can be parallel to each other in a plan view, and every even numbered substantially linear portion 24L can be parallel to each other in the plan view. The odd numbers substantially linear portions 24L are not parallel to the even numbered substantially linear portions 24L in the plan view. The first and/or second bending portions 24S, 24T can change the propagation direction of a neighboring pair of substantially linear portions 24L by an angle less than 180 degrees, which may be greater than 90 degrees and less than 180 degrees. The first and/or second bending portions (24S, 24T) may provide a gradual angle change as illustrated, or may provide an abrupt angle change with respective pointy tips.

Figure 2F:
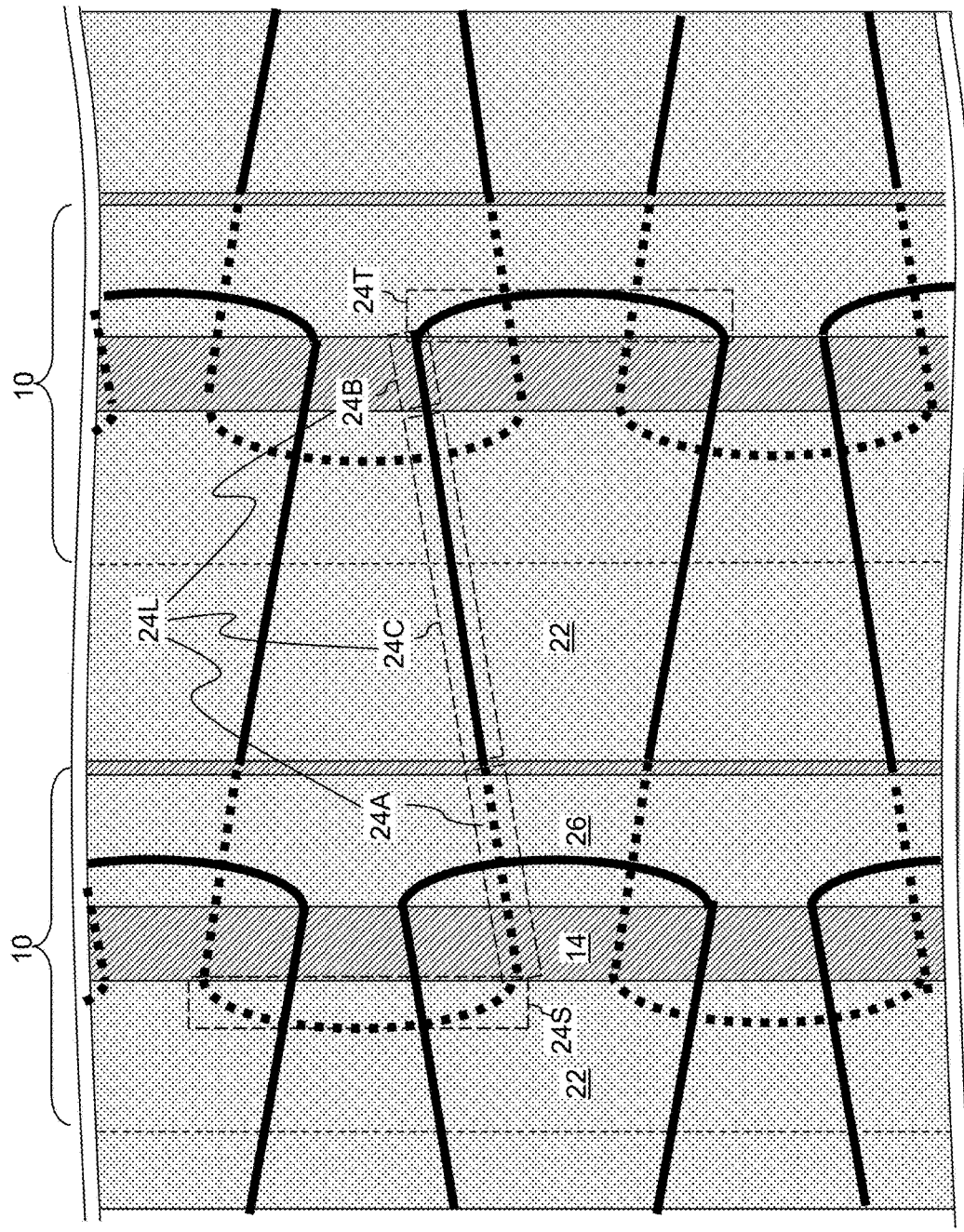

FIG. 2F illustrates another variation of the structure of FIGS. 2A-2D, which can be derived by modifying the zig-zag conductive wires 24 such that not all of the substantially linear portions 24L are parallel to one another. For example, counting from one side to another along the direction perpendicular to the connection direction cd, every odd numbered substantially linear portion 24L can be parallel to each other in a plan view, and every even numbered substantially linear portion 24L can be parallel among one another in the plan view. The odd numbers substantially linear portions 24L are not parallel to the even numbered substantially linear portions 24L in the plan view. The first and/or second bending portions 24S, 24T can change the propagation direction of a neighboring pair of substantially linear portions 24L by an angle greater than 180 degrees, which may be greater than 180 degrees and less than 270 degrees. The first and/or second bending portions (24S, 24T) may provide a gradual angle change as illustrated, or may provide an abrupt angle change with respective pointy tips.

FIG. 2G illustrates a variation of the structure of FIGS. 2E-2F, which can be derived by modifying the zig-zag conductive wires 24 of FIG. 2E or FIG. 2F such that the first and/or second bending portions (24S, 24T) have sharp turns, i.e., provides an abrupt angle change with respective pointy tips.

While the bending of the zig-zag conductive wires 24 illustrated in FIGS. 2A-2G illustrate a periodic pattern for the bending, embodiments are expressly illustrated herein in which the bending of the zig-zag conductive wires 24 is irregular, i.e., does not have a recognizable repeating pattern. Such configurations for the zig-zag conductive wires 24 can also be employed.

The flexible electrical connection structures of FIGS. 2A-2G can be modified in various manners without deviating from the spirit of the invention of the present disclosure. Illustrative examples are expressly described below.

FIG. 3 illustrates a variation of the structure of FIGS. 2E-2F in which the flexible electrically conductive structure (i.e., interconnect) 320 is the reverse of the structure 20 in FIGS. 2A-2G. In this configuration, the gap is located on the bottom (i.e., back) side of the cells 10 and sheet 22 is located over the wire 24 instead of the gap being located on the top (i.e., front) side of the cells 10 and sheet 22 being located under the wire 24. Referring to FIG. 3, each flexible transparent insulating sheet 22 can have a greater contact area with a respective second photovoltaic cell by extending the portion of the flexible transparent insulating sheet 22 over each second photovoltaic cell. Further, each flexible transparent insulating sheet 22 can have a lesser contact area with a respective first photovoltaic cell by shrinking the portion of the flexible insulating sheet 22 underneath each first photovoltaic cell.

In one embodiment, the first bending portions 24S can be contacted by a top surface of a respective underlying adhesive strip that laterally extends along a direction that is substantially perpendicular to the connection direction cd, which is a direction of the view in FIG. 3. The underlying adhesive strip 328 includes an adhesive top surface, which may be a surface of the material of the underlying adhesive strip 328 or may be an applied adhesive layer. The underlying adhesive strip 328 may be transparent or opaque. The underlying adhesive strip 328 is preferably insulating. The strip 320 may optionally be part of the interconnect (i.e., the flexible electrical connection structure) 320 or formed separate from the interconnect. Thus, in one embodiment, the flexible electrical connection structure 320 (i.e., interconnect) comprises at least the sheet 22, the strip 328 and the connector (e.g., wire) 24. The photovoltaic cells 10 are first formed as independent units and the flexible electrical connection structure 320 (i.e., interconnect) is formed separate from the photovoltaic cells 10 by forming the wire 24 in contact with the sheet 22 and the strip 328. The flexible electrical connection structure 20 comprising the wire 24, sheet 22 and strip 328 is then connected to the back side (e.g., the first electrode (2, 12)) of the first photovoltaic cell 10 and to the front side (e.g., to the second electrode 5) of the second photovoltaic cell 10 to electrically connect the two photovoltaic cells 10 in series using the wire 24.

Alternatively, the strip 328 is formed in a separate step from the sheet 22 and wire 24. In the alternative embodiment, the flexible electrical connection structure 320 (i.e., interconnect) comprises the sheet 22 and the connector (e.g., wire) 24 but not the strip 328. The photovoltaic cells 10 are first formed as independent units and the flexible electrical connection structure 320 (i.e., interconnect) is formed separate from the photovoltaic cells 10 by forming the wire 24 in contact with the sheet 22. The flexible electrical connection structure 320 comprising the wire 24 and sheet 22 is then connected to the back side (e.g., the first electrode (2, 12)) of the first photovoltaic cell 10 and to the front side (e.g., to the second electrode 5) of the second photovoltaic cell 10 to electrically connect the two photovoltaic cells 10 in series using the wire 24. The strip 328 is then formed under the wire 24 located in contact with the first electrode (2, 12) of the second photovoltaic cell 10 in a later formation step.

In one embodiment, the respective underlying adhesive strip 328 can be spaced from the respective flexible transparent insulating sheet 22 to prevent an areal overlap therebetween. In one embodiment, a gap G2 may be present between each pair of a flexible transparent insulating sheet 22 and a transparent insulating strip 328 that underlie the same photovoltaic cell (e.g., under the substrate 12). In one embodiment, the gap G2 can be in a range from 1 mm to 30 cm, although lesser and greater distances can also be employed. The underlying adhesive strips 328 can include the same material as the respective flexible transparent insulating sheet 22, and may include an adhesive material therein, may consist entirely of adhesive material or may be coated with an adhesive material on a side that contact the underlying photovoltaic cell.

Optionally, first edge insulators 330 can be formed on each side of the photovoltaic cell 10 is located under an adjacent portion 24C of the zig-zag conductive wire 24. The first edge insulators 330 may be formed by attaching insulator structures to respective sidewalls of the photovoltaic cells 10, or may be formed by coating an insulating material to the respective sidewalls of the photovoltaic cells 10. Generally speaking, the first edge insulators 330 can be inserted on any sidewall of the photovoltaic cells 10 that may touch an uncovered adjacent zig-zag conductive wire 24.

Referring to FIG. 4, the flexible electrical connection structures 420 may be modified compared to structures 20 of FIGS. 2A-2D by replacing the flexible transparent insulating sheets 22 with flexible opaque sheets 422. In case the flexible opaque sheets 422 include a conductive material, the first edge insulators 330 of FIG. 4 may be incorporated. In case the flexible opaque sheets 422 include an insulating material, the first edge insulators 330 of FIG. 4 may be omitted.

In order to increase the electrical power output of the photovoltaic cells 10, the area of the top surface of each photovoltaic cell 10 contacted by the sheet 422 can be minimized as long as sufficient mechanical adhesion is provided between the flexible opaque sheets 422 and the top surfaces of the respective photovoltaic cells 10. The flexible opaque sheets 422 may include an adhesive material, may consist entirely of an adhesive material, or may be coated with an adhesive material at location that contact the photovoltaic cells, i.e., over each second photovoltaic cell and under each first photovoltaic cell in each neighboring pair of photovoltaic cells 10. For example, the sheets 422 may be made of PET (Polyethylene terephthalate) coated with an adhesive material.

In one embodiment, each neighboring pair of photovoltaic cells 10 can be physically adjoined to each other through a respective flexible opaque sheet 422 that covers less than 10% of the front surface area (e.g., of the second electrode 5) of the second photovoltaic cell. In one embodiment, the flexible opaque sheets 422 can cover a target percentage of each photovoltaic cell 10. In one embodiment, the target percentage can be in a range from 0.2% to 10%. In one embodiment, the target percentage can be in a range from 0.5% to 8%. In one embodiment, the target percentage can be in a range from 1% to 6%. In one embodiment, the target percentage can be in a range from 2% to 4%.

In one embodiment, the overlying transparent insulating strips 26 of FIGS. 2A-2C can be modified to cover the wire 24 and portions of the flexible opaque sheets 422 that contact the front surface of the photovoltaic cells 10. The overlying transparent insulating strips 426 in FIG. 4 can have the same composition and thickness as the overlying transparent insulating strips 26 of FIGS. 2A-2G. The strips 426 may optionally be considered part of the interconnect (i.e., structure 420).

Thus, in one embodiment, the flexible electrical connection structure 420 (i.e., interconnect) comprises at least the sheet 422, the strip 426 and the connector (e.g., wire) 24. The photovoltaic cells 10 are first formed as independent units and the flexible electrical connection structure 420 (i.e., interconnect) is formed separate from the photovoltaic cells 10 by forming the wire 24 in contact with the sheet 422 and the strip 426. The flexible electrical connection structure 20 comprising the wire 24, sheet 422 and strip 426 is then connected to the back side (e.g., the first electrode (2, 12)) of the first photovoltaic cell 10 and to the front side (e.g., to the second electrode 5) of the second photovoltaic cell 10 to electrically connect the two photovoltaic cells 10 in series using the wire 24. In this case, each flexible opaque sheet 422 may be contacted by a bottom surface of a respective overlying transparent insulating strip 426 that contacts the second photovoltaic cell. Each overlying transparent insulating strip 426 can cover a predominant portion (more than 50%) of the top surface of a respective photovoltaic cell 10. In one embodiment, overlying transparent insulating strip 426 can cover at least 90% of the top surface of a respective photovoltaic cell 10. If desired, edge insulators may be added on opposite sides of the cells 10 from the sides shown in FIG. 3.

Alternatively, the strip 426 is formed in a separate step from the sheet 422 and wire 24. In the alternative embodiment, the flexible electrical connection structure 420 (i.e., interconnect) comprises the sheet 422 and the connector (e.g., wire) 24 but not the strip 426. The photovoltaic cells 10 are first formed as independent units and the flexible electrical connection structure 420 (i.e., interconnect) is formed separate from the photovoltaic cells 10 by forming the wire 24 in contact with the sheet 422. The flexible electrical connection structure 420 comprising the wire 24 and sheet 422 is then connected to the back side (e.g., the first electrode (2, 12)) of the first photovoltaic cell 10 and to the front side (e.g., to the second electrode 5) of the second photovoltaic cell 10 to electrically connect the two photovoltaic cells 10 in series using the wire 24. The strip 426 is then formed over the wire 24 located in contact with the second electrode 5 of the second photovoltaic cell 10 in a later formation step.

Referring to FIG. 5, the flexible electrically conductive structure 520 does not include the sheet 22 and instead includes a combination of an overlying transparent insulating strip 526 and an underlying adhesive strip 528. A free-hanging portion 24F of each zig-zag conductive wire 24 does not contact any supporting sheet. The free-hanging portion 24F is a portion of the connection portion 24C of the zig-zag conductive wire 24.

The overlying transparent insulating strip 526 of FIG. 5 can be derived from the overlying transparent insulating strip 26 of FIGS. 2A-2C by increasing the area covered by the overlying transparent insulating strip 526 to provide a more secure mechanical connection between the zig-zag conductive wire 24 and the second photovoltaic cell. Strip 526 may be the same as strip 426 described above. Specifically, the adhesion between the adhesive surface of the overlying transparent insulating strip 526 (or an adhesive material thereupon) and each of the underlying photovoltaic cell and the underlying zig-zag conductive wire 24 can increase by increasing the area of the overlying transparent insulating strip 526.

The underlying adhesive strip 528 of FIG. 5 can be derived from the underlying adhesive strip 328 of FIG. 3 by increasing the area contacted by the underlying adhesive strip 328 to provide a more secure mechanical connection between the zig-zag conductive wire 24 and the first photovoltaic cell. Specifically, the adhesion between the adhesive surface of the underlying adhesive strip 528 and each of the overlying photovoltaic cell and the overlying zig-zag conductive wire 24 can increase by increasing the area of the underlying adhesive strip 328.

In this case, each second electrode 5 can be contacted by a respective overlying transparent insulating strip 526 and the second bending portions 24T. Each first electrode (2, 12) can be contacted by a respective underlying adhesive strip 328 and the first bending portions 24S.

Similar to the embodiments described above, the strips 526 and/or 528 may comprise part of the interconnect 520 (i.e., be pre-formed together with the wire 24 and then attached together with the wire 24 to the photovoltaic cells 10) or the strips 526 and/or 528 may be formed separately (i.e., after) the interconnect 520 comprising the wire 24 is attached to the photovoltaic cells 10.

Optionally, second edge insulators 340 may be employed in addition to, or instead of, the first edge insulators 330 to provide additional electrical insulation between the zig-zag conductive wires 24 and sidewalls of the photovoltaic cells 10 that are at different potentials. While the first edge insulators 330 and the second edge insulators 340 are illustrated only for some embodiments of the present disclosure, it is understood that the first edge insulators 330 and the second edge insulators 340 may be employed in any of the structures disclosed herein wherever there is a possibility of electrical shorts during bending of the zig-zag conductive wires 24.

Optionally, the overlying transparent insulating strip 526 of FIG. 5 may be modified to cover the portion of the zig-zag conductive wire 24 that is identified as the free-hanging portion 24F. In this case, the overlying transparent insulating strip 526 can contact a predominant portion of the connection portions 24C of the zig-zag conductive wire 24 as illustrated in FIG. 6.

With or without modification of the overlying transparent insulating strip 526 of FIG. 5, the multiple underlying adhesive strips 528 of FIG. 5 may be replaced with a single adhesive sheet 628 shown in FIG. 6, which can have the same composition as the multiple underlying adhesive strips 528 of FIG. 5 and forms a continuous sheet that underlies multiple photovoltaic cells 10. The sheet 628 may be transparent or opaque. In this configuration, each first electrode (2, 12) of the plurality of photovoltaic cells 10 and each of the first bending portions 24S can be contacted by a common underlying adhesive sheet 628. In this embodiment, the flexible electrically conductive structure 620 includes strip 526, wire 24 and sheet 628.

Similar to the embodiments described above, the strip 526 and/or sheet 628 may comprise part of the interconnect 620 (i.e., be pre-formed together with the wire 24 and then attached together with the wire 24 to the photovoltaic cells 10) or the strip 526 and/or sheet 528 may be formed separately (i.e., after) the interconnect 620 comprising the wire 24 is attached to the photovoltaic cells 10.

Referring to FIG. 7, the flexible electrical connection structures of FIG. 3 can be modified to replace the underlying insulating adhesive strips 328 with electrically conductive foils 728. The foils 728 may include an elemental metal, an intermetallic alloy, or a conductive metal alloy of at least one metal and a non-metallic element (such as TiN). For example, the foils 728 can be aluminum foils. In this case, each first electrode (2, 12) of the plurality of photovoltaic cells 10 and each of the first bending portions 24S can be contacted by a respective foil 728 that underlies the respective photovoltaic cell.

Similar to the embodiments described above, the foil 728 may comprise part of the interconnect 720 (i.e., be pre-formed together with the wire 24 and sheet 22 and then attached together with the wire 24 to the photovoltaic cells 10) or the foil 728 may be formed separately (i.e., after) the interconnect 720 comprising the wire 24 and sheet 22 is attached to the photovoltaic cells 10.

Referring to FIG. 8, the flexible electrical connection structures 20, 420 of FIGS. 2A-2G or 4 can be modified to replace the overlying transparent insulating strips 26, 426 with a common overlying transparent insulating sheet 826. The overlying transparent insulating sheet 826 can have the same composition as the as the overlying transparent insulating strips 26, 426 of FIGS. 2A-2G or 4 and forms a continuous sheet that overlies multiple photovoltaic cells 10. In this case, each second electrode 5 of the plurality of photovoltaic cells 10 and each of the second bending portions 24T can be contacted by the common overlying transparent insulating sheet 826.

Similar to the embodiments described above, the sheet 826 may comprise part of the interconnect 820 (i.e., be pre-formed together with the wire 24 and sheet (22, 422) and then attached together with the wire 24 to the photovoltaic cells 10) or the sheet 826 may be formed separately (i.e., after) the interconnect 820 comprising the wire 24 and sheet (22, 422) is attached to the photovoltaic cells 10.

Referring to FIGS. 9A and 9B, the flexible electrical connection structures of FIGS. 2A-2G can be modified to replace the flexible transparent insulating sheets 22 with flexible transparent insulating scrims 922. Each flexible transparent insulating scrim 922 can have a pattern of openings, which may have a periodic pattern or a random pattern. In one embodiment, an adhesive material can be applied to surfaces of the flexible transparent insulating scrims 922 that contact the photovoltaic cells 10. In one embodiment, the openings in the flexible transparent insulating scrims 922 can be filled with an adhesive material. Exemplary flexible transparent insulating scrims 922 include glass scrims, fiberglass scrims, and plastic scrims. A scrim may comprise a mesh or gauze made of any suitable fibers, such as glass or cloth fibers. In this case, each neighboring pair of photovoltaic cells 10 can be physically adjoined to each other through a respective flexible transparent insulating scrim 922.

In one embodiment, the flexible electrical connection structures of FIGS. 2A-2G can be further modified to replace the overlying transparent insulating strips 26 of FIGS. 2A-2G with the transparent insulating strips 526 as employed in the flexible electrical connection structures of FIG. 5. In this case, an adhesive material can be employed in each overlap region between each transparent insulating strip 526 and an underlying flexible transparent insulating scrims 922. Thus, each flexible transparent insulating scrim 922 can be contacted by an overlying transparent insulating strip 526 that laterally extends along a direction (such as the direction of the view of FIG. 9A) that is substantially perpendicular to the connection direction cd and contacts a respective underlying photovoltaic cell 10.

Similar to the embodiments described above, the strip (26, 526, 926) may comprise part of the interconnect 920 (i.e., be pre-formed together with the wire 24 and scrim 922 and then attached together with the wire 24 and scrim 922 to the photovoltaic cells 10) or the strip may be formed separately (i.e., after) the interconnect 920 comprising the wire 24 and scrim 922 is attached to the photovoltaic cells 10.

Referring to FIGS. 10A and 10B, the flexible electrical connection structures of FIG. 5 can be modified to replace the underlying adhesive strips 528 an adhesive coating 1028. The adhesive coating 1028 may be applied only to portions of the zig-zag conductive wires 24, or may cover the entirety of each zig-zag conductive wires 24. Each combination of a zig-zag conductive wire 24 and the adhesive coating 1028 thereupon constitutes a coated zig-zag conductive wire 1030. The coating 1028 may be conductive or insulating. The conductive adhesive coating 1028 includes a conductive material such as conductive paste. In this case, at least a portion of each coated zig-zag conductive wire 1030 is free-hanging between a respective pair of photovoltaic cells 10, i.e., is not attached to any sheet or otherwise supported by another structure within the volume between the pair of photovoltaic cells 10. If the coating 1028 is insulating, then the wire 24 is pressed into direct contact with the substrate 12 of the cell 10 and the coating 1028 adheres the sides of the wire 24 to the substrate.

In one embodiment, the first bending portions 24S and the first end portions 24A of the plurality of substantially linear portions 24L can be coated with an adhesive material (e.g., paste or ink) to provide the adhesive coating 1028. In one embodiment, the second bending portions 24T and the second end portions 24B of the plurality of substantially linear portions 24L can be contacted by an overlying transparent insulating strip (26, 526).

Similar to the embodiments described above, the strip (26, 526) may comprise part of the interconnect 1020 (i.e., be pre-formed together with the wire 1030 and then attached together with the wire 1030 to the photovoltaic cells 10) or the strip may be formed separately (i.e., after) the interconnect 1020 comprising the wire 1030 is attached to the photovoltaic cells 10.

The second bending portions 24T and the second end portions 24B of the plurality if substantially linear portions 24L can be free of the conductive adhesive coating material (i.e., not coated with the conductive adhesive coating material of the conductive adhesive coating 1028) as illustrated in FIGS. 10A and 10B, or may be coated with the conductive adhesive material as illustrated in FIGS. 11A and 11B. In one embodiment, the entirety of each zig-zag conductive wire 24 can be coated with the conductive adhesive coating 1028.

Figure 12:
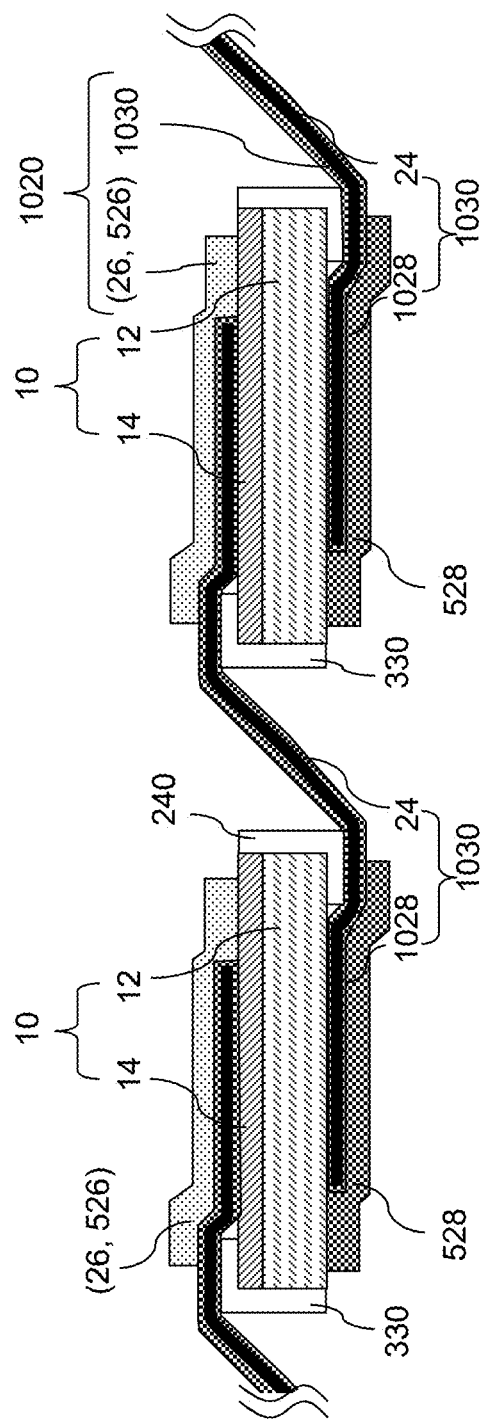
FIG. 12 illustrates a vertical cross-sectional view of eleventh exemplary interconnected solar cells according to an embodiment of the present disclosure.

The flexible electrical connection structures of FIGS. 10A, 10B, 11A, and 11B can be modified to attach underlying adhesive strips 528 illustrated in FIG. 5 to the bottom surface of each photovoltaic cell 10. In this case, the coated conductive adhesive material of the conductive adhesive coating 1028 can be contacted by an underlying adhesive strip as illustrated in FIG. 12.

Figure 13:
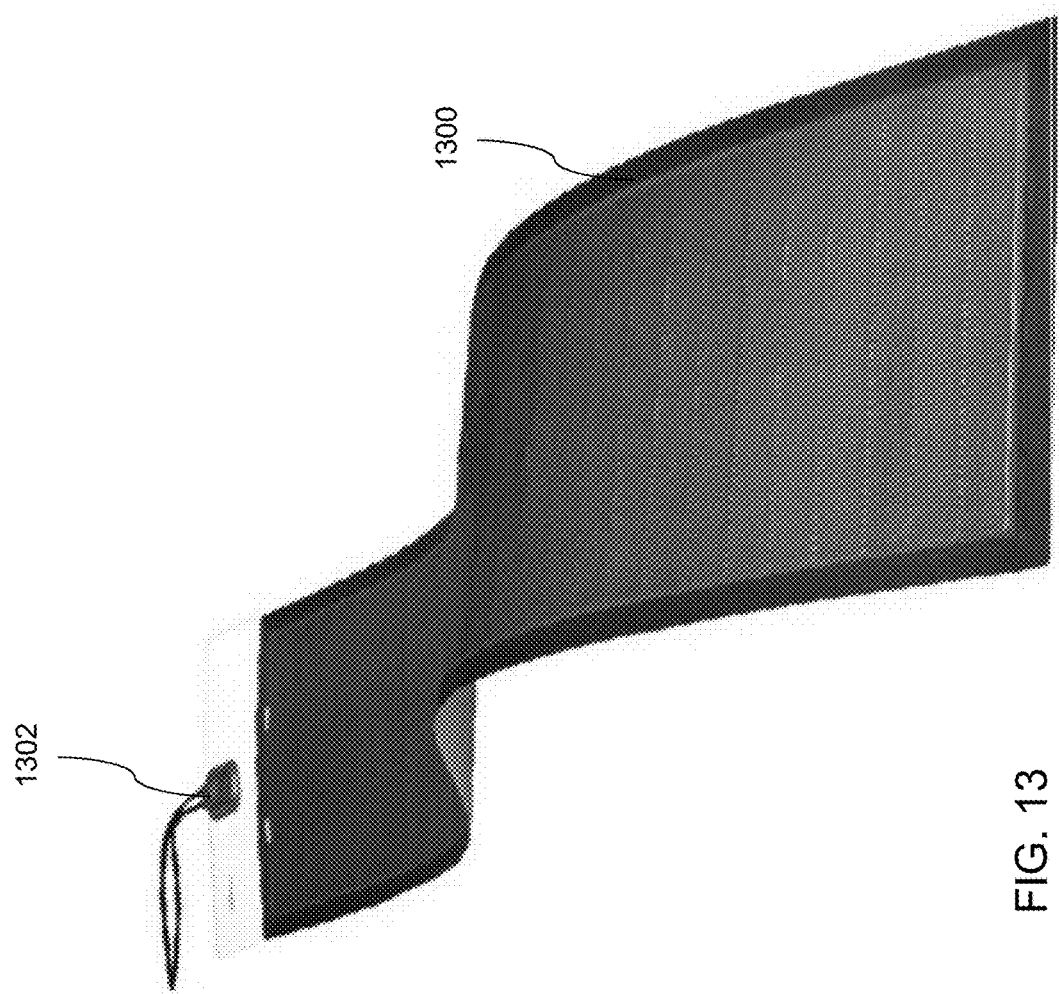
FIG. 13 illustrates a perspective view of a solar panel according to an embodiment of the present disclosure.

FIG. 13 illustrates a solar panel (i.e., module) 1300 that can be formed by adjoining a plurality of photovoltaic cells employing the flexible electrical connection structures of the present disclosure. Preferably, the substrate 12 is flexible and the panel 1300 is also flexible. The panel 1300 contains the plurality of photovoltaic cells 10 interconnected by any of the flexible electrically conductive structures (i.e., interconnects) described above, and an electrical output 1302. While the various drawings herein illustrate a gap (lateral distance) between a neighboring pair of photovoltaic cells 10 that is comparable to the lateral dimensions of the photovoltaic cells 10, the lateral dimensions of the photovoltaic cells 10 may be orders of magnitude greater than the dimensions of the gap, thereby providing an appearance of a continuous sheet. Further, structures illustrated in FIGS. 2A-2G and 3-9 provide a flexible sheet structure between neighboring photovoltaic cells, thereby providing an appearance of continuity on a surface of the solar panel.

Generally speaking, the solar panels of the present disclosure can be formed by providing a plurality of photovoltaic cells 10. Each of the plurality of photovoltaic cells 10 comprises a photovoltaic junction (3, 4), a first electrode (2, 12) located on a first (e.g., back) side of the photovoltaic junction (3, 4), and a second electrode 5 located on a second (e.g., front) side of the photovoltaic junction (3, 4) to provide a power output from the photovoltaic junction (3, 4) across the first and second electrodes upon illumination of light. A zig-zag conductive wire 24 can be attached to each neighboring pair of a first photovoltaic cell and a second photovoltaic cell. The respective zig-zag conductive wire 24 comprises a plurality of substantially linear portions 24L, first bending portions 24S that contact a first electrode (2, 12) of the first photovoltaic cell, and second bending portions 24T that contact a second electrode 5 of the second photovoltaic cell.

The first bending portions 24S adjoin neighboring pairs of the plurality of substantially linear portions 24L underneath the first electrode (2, 12) of the first photovoltaic cell. The second bending portions 24T adjoin neighboring pairs of the plurality of substantially linear portions 24L over the second electrode 5 of the second photovoltaic cell. Each of the plurality of substantially linear portions 24L comprises a first end portion 24A that underlies and contacts the first electrode (2, 12) of the first photovoltaic cell, a second end portion 24B that overlies and contacts the second electrode 5 of the second photovoltaic cell, and a connection portion 24C that connects the first end portion 24A and the second end portion 24B and does not directly contact the first or second photovoltaic cells. Each substantially linear portion 24L extends farther along the connection direction cd than along any direction that is perpendicular to the connection direction 24.

In one embodiment, the zig-zag conductive wires 24 provide a flexible electrical connection structure between each neighboring pair of the plurality of photovoltaic cells 10 along the connection direction cd. In one embodiment, each of the flexible electrical connection structures is configured to provide variable angles α between top surfaces of each neighboring pair of photovoltaic cells 10.

In one embodiment, a respective flexible transparent insulating sheet 22 can be attached to each neighboring pair of the plurality of photovoltaic cells 10 and to a zig-zag conductive wire 24 therebetween.

In one embodiment, a respective flexible opaque sheet 422 may be attached to each neighboring pair of photovoltaic cells 10. Each flexible opaque sheet 422 covers less than 10% of a front surface area of the second photovoltaic cell in each neighboring pair of the plurality of photovoltaic cells 10.

In one embodiment, overlying transparent insulating strips (26, 426, 526, 926) can be attached to the top surface of each photovoltaic cell 10. In this case, the second electrode 5 is contacted by a respective overlying transparent insulating strip that contacts the second bending portions 24T.

In one embodiment, a respective metallic foil 728 can be attached to each first electrode (2, 12) and to each first bending portions 24S thereupon.

In one embodiment, the same overlying insulating sheet 826 can be attached to each second electrode 5 and each second bending portion 24T thereupon.

In one embodiment, a respective flexible transparent insulating scrim 922 can be attached to each neighboring pair of the plurality of photovoltaic cells 10.

In one embodiment, the first bending portions 24S and the first end portions 24A of the plurality of substantially linear portions 24L can be coated with a conductive adhesive material prior to attaching at least one of the zig-zag conductive wires 24.

In one embodiment, the second bending portions 24T and the second end portions 24B of the plurality of substantially linear portions 24L can be coated with the conductive adhesive material prior to attaching at least one of the zig-zag conductive wires 24.

In one embodiment, a respective overlying transparent insulating strip (26, 426, 526, 926) can be attached to the second bending portions 24T and the second end portions 24B of the zig-zag conductive wires 24 as illustrated in FIGS. 10A, 10B, 11A, 11B, and 12.

In one embodiment, an underlying adhesive strip 528 can be attached to the first bending portions 24T and the first end portions 24A of the zig-zag conductive wires 24.

One non-limiting advantage of the above described embodiments is that the zig-zag wire of the interconnect does not extend from a first major surface of a flexible transparent insulating sheet through a thickness of the insulating support sheet to a second major surface of the insulating support sheet. This simplifies the manufacturing of the interconnect because there is no need to thread the wire through a hole in the insulating sheet or to glue two separate portions of an insulating sheet together on opposite sides of the wire to form the interconnect.

Another non-limiting advantage of some of above described embodiments is that narrow insulating strips rather than continuous sheets may be located above the front electrodes of the photovoltaic cells. This may leave a gap in the insulating material to provide solar radiation to the photovoltaic cell which is not partially attenuated by the transparent insulating sheet.

Another non-limiting advantage of some of the above described embodiments is that conductive foils, opaque sheets or insulating scrims may be used instead of large transparent insulating sheets. These may improve the electrical contact resistance and permit the use of interconnect materials which may have a lower cost or better structural or thermal properties than a transparent polymer sheet.

Any of the zig-zag conductive connector as embodied as a zig-zag conductive wire 24 in any of the previously described embodiments can be replaced with a network conductive connector 124 in corresponding alternative embodiments. As used herein, a "network conductor connector" refers to multiple conductive connectors (e.g., wires) that are configured such that the multiple conductive connectors (e.g., wires) are connected to provide at least one opening therein and each conductive connectors (e.g., wires) is connected to every other conductive connectors (e.g., wires) either directly or indirectly via one or more intermediate conductive connectors (e.g., wires). The network conductive connector 124 may comprise a mesh having any suitable configuration, such as a woven, grid, hexagonal, chicken wire, etc., mesh.

In this case, each neighboring pair of photovoltaic cells can be connected via a network conductive connector 124 in lieu of a zig-zag conductive wire 24. End portions of network conductive connector 124 contacts surfaces of the photovoltaic cells that bending portions (24S, 24T) of a zig-zag conductive wire 24 contact to provide electrical connection between each neighboring pair of photovoltaic cells.

Figure 14:
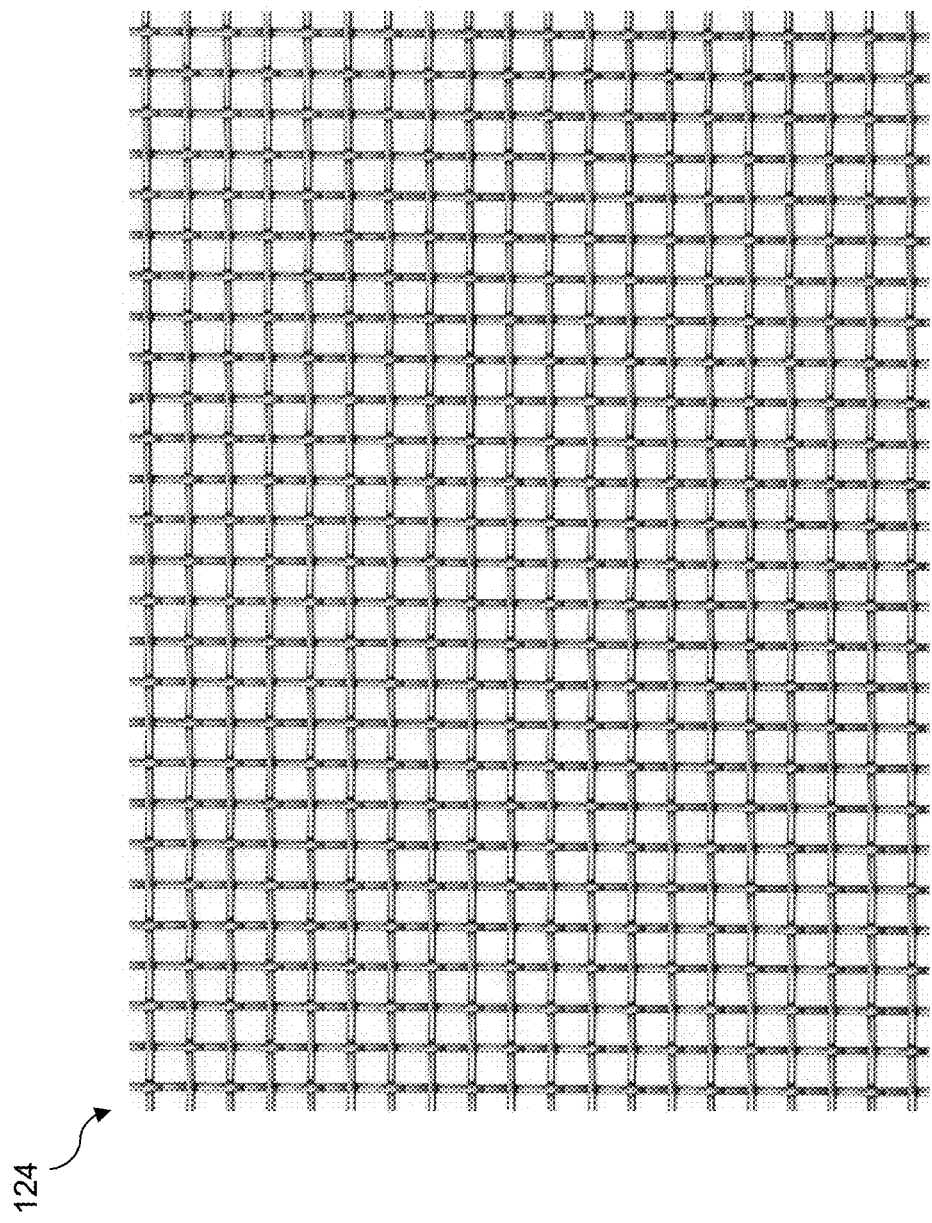
FIG. 14 illustrates a first exemplary network conductive connector that can be employed in lieu of a zig-zag conductive wire in any of the embodiments of the present disclosure.

FIG. 14 illustrates a first exemplary network conductive connector 124, which employs an over-and-under criss-cross configuration (e.g., an architectural wire mesh in a woven grid pattern). In the over-and-under criss-cross configuration, a first set of wires generally extend along a first horizontal direction, and a second set of wired generally extend along a second horizontal direction that is different from the first horizontal direction. Each wire in the first set of wires is alternately positioned over, or under, every other wire among the second set of wires along the propagation direction of the first set of wires. For example, each wire in the first set of wires can be positioned over a first wire among the second set of wires, under a second wire among the second set of wires that is immediately next to the first wire among the second set of wires, over a third wire among the second set of wires that is immediately next to the second wire among the second set of wires, etc. The same geometry applies to each wire in the second set of wires in a similar manner.

Figure 15:
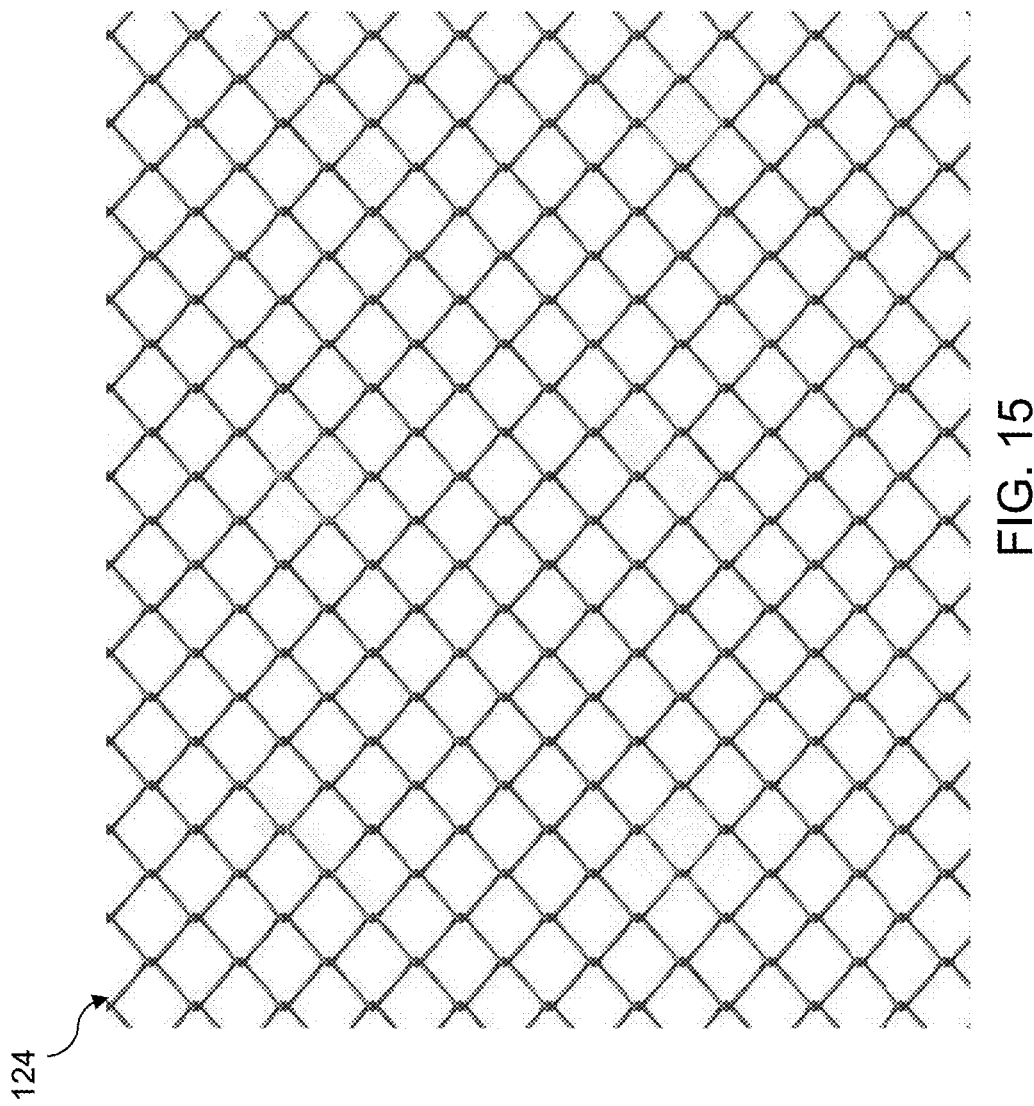
FIG. 15 illustrates a second exemplary network conductive connector that can be employed in lieu of a zig-zag conductive wire in any of the embodiments of the present disclosure.

FIG. 15 illustrates a second exemplary network conductive connector 124, which employs a single twist network configuration (e.g., chicken wire mesh). In the single twist network configuration, all conductive wires generally propagate along a same direction, and each conductive wire is alternately twisted with another wire on a first side and yet another wire on a second side that is the opposite side of the first side. The wires are twisted only once at each joint.

Figure 16:
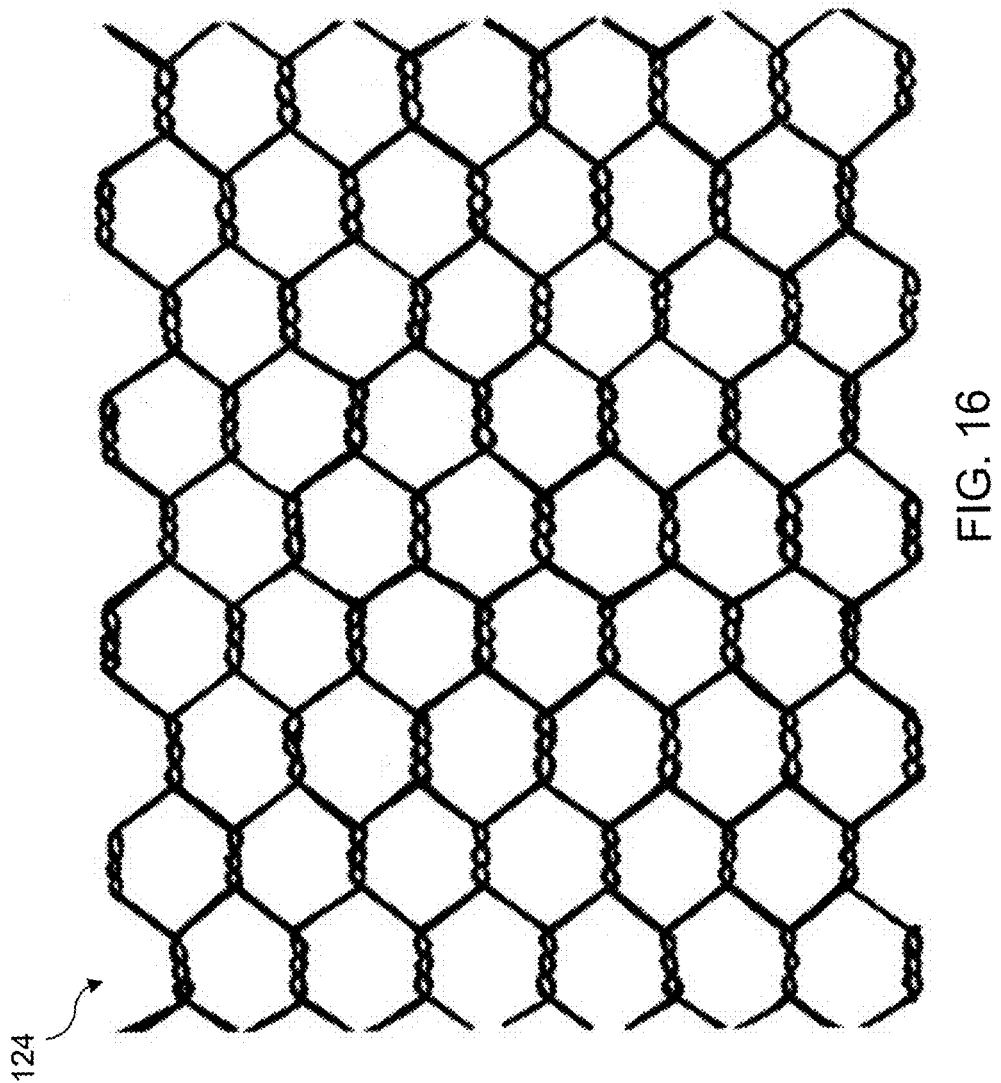
FIG. 16 illustrates a third exemplary network conductive connector that can be employed in lieu of a zig-zag conductive wire in any of the embodiments of the present disclosure.

FIG. 16 illustrates a third exemplary network conductive connector 124, which employs a multi twist network configuration. In the multi twist network configuration, all conductive wires generally propagate along a same direction, and each conductive wire is alternately twisted with another wire on a first side and yet another wire on a second side that is the opposite side of the first side. The wires are twisted multiple times at each joint. The conductive network connector 124 forms a hexagonal mesh with hexagonal shaped openings.

Figure 17:
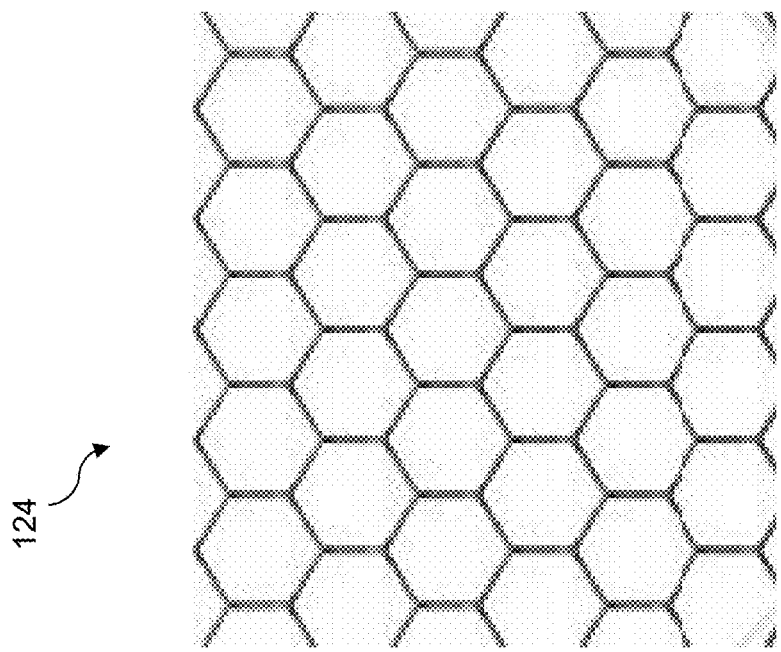
FIG. 17 illustrates a fourth exemplary network conductive connector that can be employed in lieu of a zig-zag conductive wire in any of the embodiments of the present disclosure.

FIG. 17 illustrates a fourth exemplary network conductive connector 124, which can be a patterned layer having a uniform thickness and including openings or a wire mesh having wires connected (e.g., welded) rather than twisted or crossed at their intersections. The openings can be hexagonal, circular, or otherwise generally curvilinear or polygonal. In one embodiment, the openings can form a periodic array such as a hexagonal array or a rectangular array. The conductive network connector 124 forms a honeycomb array shaped mesh having hexagonal shaped openings surrounded by wires.

Figure 18:
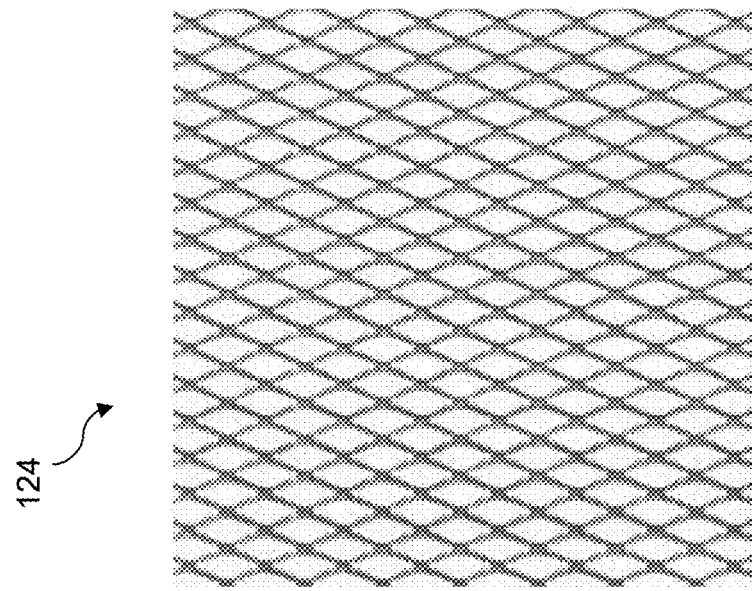
FIG. 18 illustrates a fifth exemplary network conductive connector that can be employed in lieu of a zig-zag conductive wire in any of the embodiments of the present disclosure.

FIG. 18 illustrates a fifth exemplary network conductive connector 124, which can be derived from the fourth exemplary network conductive connector 124 of FIG. 17 by modifying the pattern of openings and wires therein to form a parallelogram array. The network conductive connector 124 forms a mesh having parallelogram or rhombus shaped openings surrounded by wires.

Although the foregoing refers to particular preferred embodiments, it will be understood that the present invention is not so limited. It will occur to those of ordinary skill in the art that various modifications may be made to the disclosed embodiments and that such modifications are intended to be within the scope of the present invention. It is to be understood that the present invention is not limited to the embodiment(s) and the example(s) described above and illustrated herein, but encompasses any and all variations falling within the scope of the appended claims. For example, as is apparent from the claims and specification, not all method steps need be performed in the exact order illustrated or claimed, but rather in any order that allows the proper formation of the solar cells of the present invention.

What is claimed is:
1. A solar panel comprising:
    a first photovoltaic cell;
    a second photovoltaic cell;
    a flexible electrical connection structure that electrically connects the first photovoltaic cell and the second photovoltaic cell in series along a connection direction, the flexible connection structure comprising an electrically conductive connector, a flexible transparent insulating sheet, and an adhesive strip, wherein the electrically conductive connector extends from a back side of the first photovoltaic cell to a front side of the second photovoltaic cell;

the flexible transparent insulating sheet is disposed on a single side of the electrically conductive connector, so as to be disposed between the electrically conductive connector and a portion of the back side of the first photovoltaic cell; and the adhesive strip is disposed on the back side of the first photovoltaic cell, over the electrically conductive connector, and spaced apart from the flexible transparent insulating sheet, such that a portion of the electrically conductive connector extends through the space between the adhesive strip and the flexible transparent insulator sheet.

2. The solar panel of claim 1, wherein each of the first and second photovoltaic cells comprise a photovoltaic junction, a first electrode located on a first side of the photovoltaic junction, and a second electrode located on a second side of the photovoltaic junction; and wherein the electrically conductive connector comprises a zig-zag wire.

3. The solar panel of claim 2, wherein:

the zig-zag wire comprises a plurality of substantially linear portions, first bending portions that contact a first electrode of the first photovoltaic cell, and second bending portions that contact a second electrode of the second photovoltaic cell;

the first bending portions adjoin neighboring pairs of the plurality of substantially linear portions underneath the first electrode of the first photovoltaic cell;

the second bending portions adjoin neighboring pairs of the plurality of substantially linear portions over the second electrode of the second photovoltaic cell;

each of the plurality of substantially linear portions comprises a first end portion that underlies and contacts the first electrode of the first photovoltaic cell, a second end portion that overlies and contacts the second electrode of the second photovoltaic cell, and a connection portion that connects the first end portion and the second end portion and does not directly contact the first or second photovoltaic cells; and each substantially linear portion extends farther along the connection direction than along any direction that is perpendicular to the connection direction.

4. The solar panel of claim 2, wherein the first and the second photovoltaic cells do not overlap each other.

5. The solar panel of claim 1, wherein the flexible transparent insulating sheet comprises an adhesive material sheet or a non-adhesive material sheet which is attached to the first and second photovoltaic cells by an adhesive material or an adhesive surface.

6. The solar panel of claim 2, wherein the flexible transparent insulating sheet comprises a first end region that underlies and contacts the first electrode of the first photovoltaic cell, a second end region that overlies and contacts the second electrode of the second photovoltaic cell, and a connection region.

7. The solar panel of claim 6, wherein an entirety of the first end portion of the zig-zag wire is located between the first photovoltaic cell and the first end region of the flexible transparent insulating sheet.

8. A solar panel comprising:

a first photovoltaic cell;

a second photovoltaic cell;

a flexible electrical connection structure that electrically connects the first photovoltaic cell and the second photovoltaic cell in series along a connection direction, the flexible connection structure comprising an electrically conductive zig-zag wire, a flexible transparent insulating sheet, and an adhesive strip; wherein:

the zig-zag wire extends from a back side of the first photovoltaic cell to a front side of the second photovoltaic cell; the flexible transparent insulating sheet is disposed on a single side of the zig-zag wire, so as to be disposed between the zig-zag wire and a portion of the back side of the first photovoltaic cell; the adhesive strip is disposed on a back side of the first photovoltaic cell, over the zig-zag wire, and spaced apart from the flexible transparent insulating sheet, such that a portion of the zig-zag wire extends through the space between the adhesive strip and the flexible transparent insulating sheet; and the flexible transparent insulating sheet comprises a first end region that underlies and contacts the first electrode of the first photovoltaic cell, a second end region that overlies and contacts the second electrode of the second photovoltaic cell, and a connection region.

9. The solar panel of claim 2, further comprising a first edge insulator covering an entirety of a sidewall of the second photovoltaic cell that is proximal to the first photovoltaic cell and a portion of a top surface of the first electrode and the second photovoltaic cell.

10. The solar panel of claim 9, wherein:

the first major surface of the flexible transparent insulating sheet has a first adhesive coating that contacts the first electrode of the second photovoltaic cell and the electrically conductive connector; and the second major surface of the flexible transparent insulating sheet has a second adhesive coating that contacts the second electrode of the first photovoltaic cell.

\* \* \* \* \*